(12) United States Patent
Hirobe

(10) Patent No.: US 8,391,087 B2
(45) Date of Patent: Mar. 5, 2013

(54) SEMICONDUCTOR DEVICE

(75) Inventor: Atsunori Hirobe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 85 days.

(21) Appl. No.: 13/164,472

(22) Filed: Jun. 20, 2011

(65) Prior Publication Data

US 2011/0310681 A1 Dec. 22, 2011

(30) Foreign Application Priority Data

Jun. 21, 2010 (JP) ................. 2010-140541

(51) Int. Cl.
*G11C 7/00* (2006.01)
(52) U.S. Cl. ........... 365/189.17; 365/189.05; 365/189.14
(58) Field of Classification Search ............. 365/189.05, 365/189.14, 189.17, 189.04, 191, 194, 233.1, 365/233.03, 236
See application file for complete search history.

(56) References Cited

U.S. PATENT DOCUMENTS

| | | | | |
|---|---|---|---|---|
| 5,978,303 | A * | 11/1999 | Takasugi et al. | 365/230.03 |
| 6,606,277 | B2 * | 8/2003 | Takahashi | 365/233.1 |
| 6,788,616 | B2 * | 9/2004 | Takahashi | 365/230.01 |
| 7,222,224 | B2 | 5/2007 | Woo et al. | |

FOREIGN PATENT DOCUMENTS

JP 2008-500668 A 1/2008

\* cited by examiner

*Primary Examiner* — Gene Auduong
(74) *Attorney, Agent, or Firm* — Foley & Lardner LLP

(57) ABSTRACT

A semiconductor device includes a bidirectional first bus arranged in common for a plurality of memory array basic units transferring write data and read data, a second bus transferring address/command, a plurality of first buffer circuits receiving addresses/command transferred to the second bus, wherein a control delay for generating the address/command and preparing write data to the first bus for write access and an output delay for outputting read data are both set to a length greater than or equal to a selection time for writing or reading of data to a memory cell of a selected area.

14 Claims, 21 Drawing Sheets

FIG. 3  RELATED ART
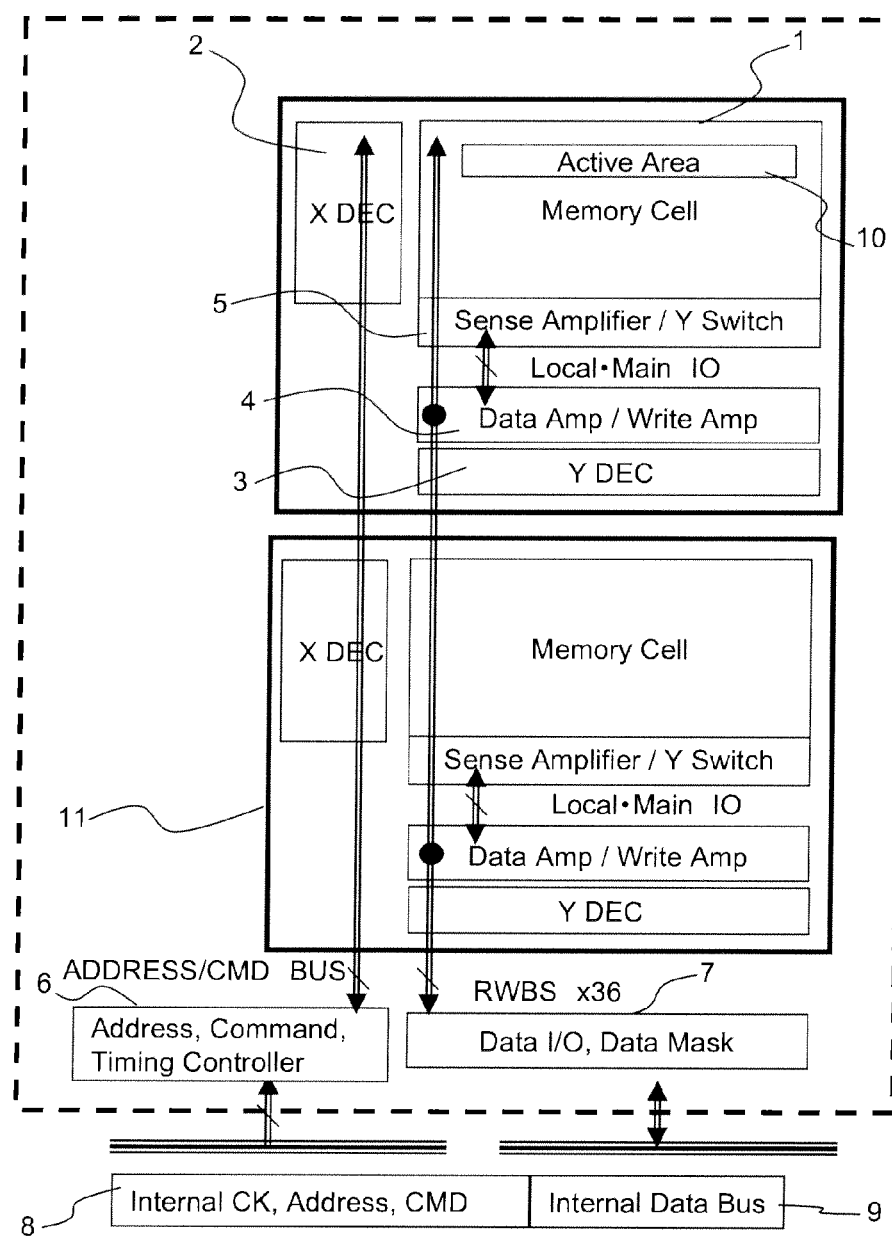

FIG. 4 RELATED ART
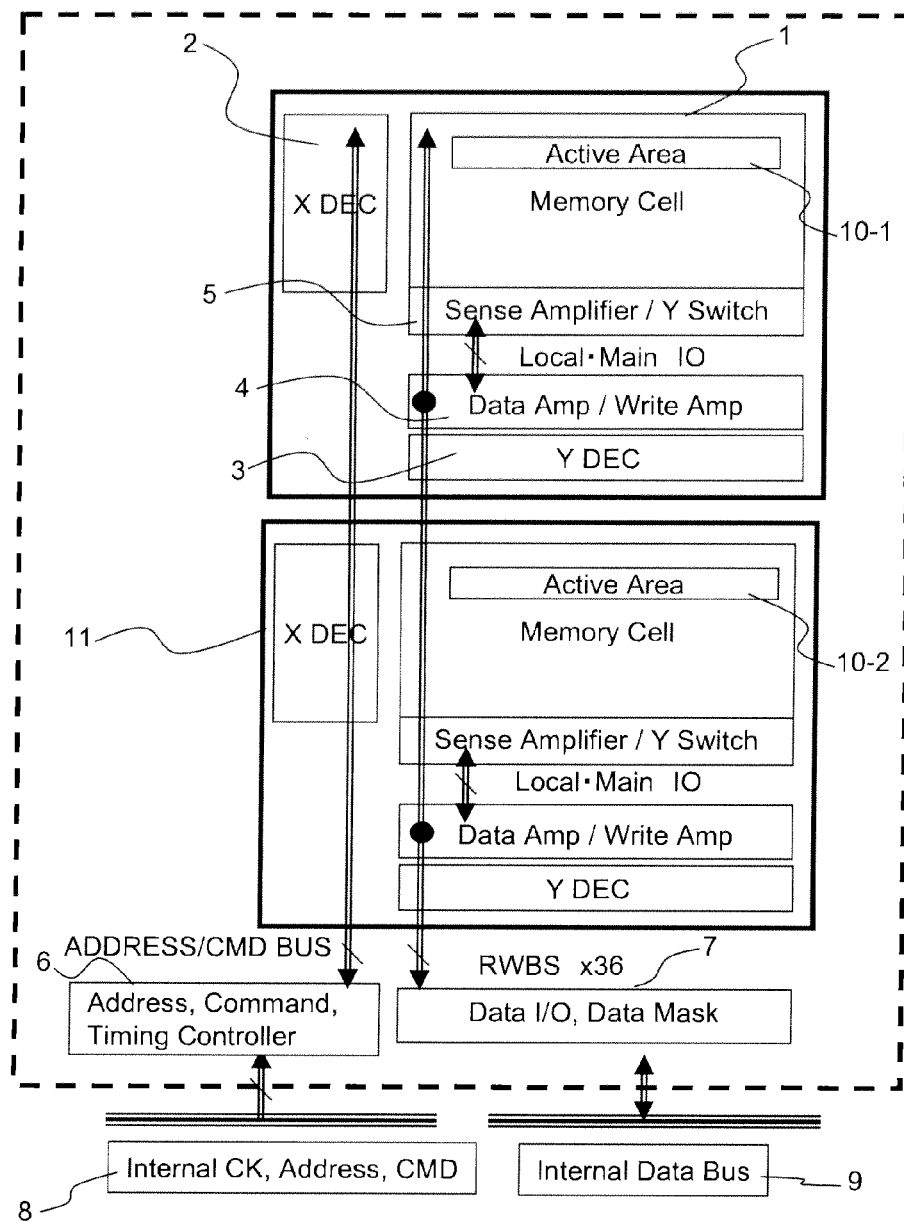

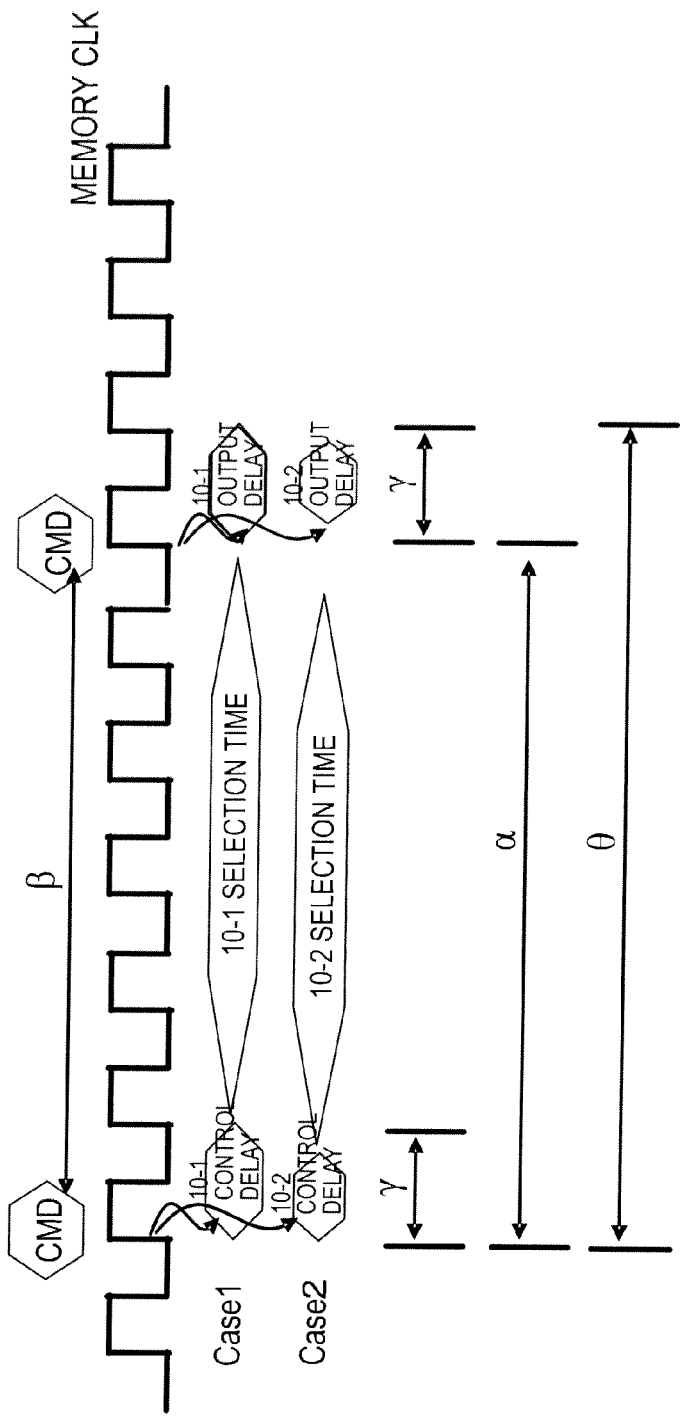

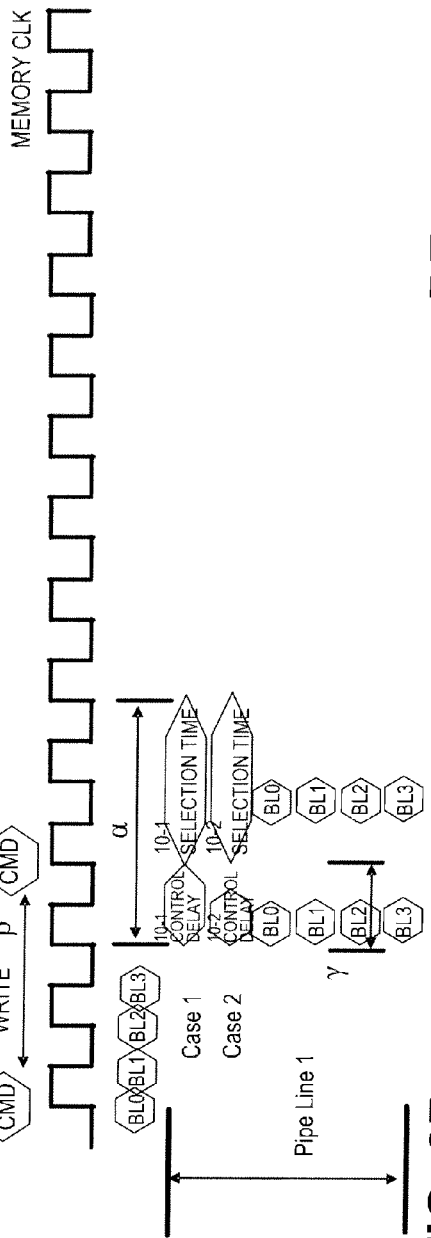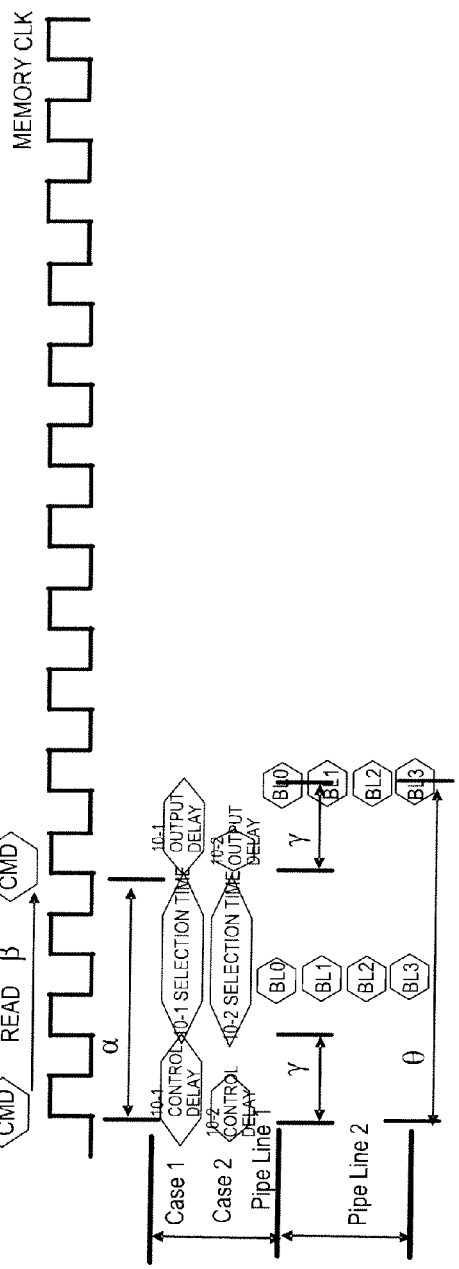

SEMICONDUCTOR DEVICE

TECHNICAL FIELD (Reference to Related Application)

This application is based upon and claims the benefit of priority of Japanese patent application No. 2010-140541, filed on Jun. 21, 2010, the disclosure of which is incorporated herein in its entirety by reference thereto. The present invention relates to a semiconductor device, and in particular to a semiconductor device provided with a memory cell array.

BACKGROUND

In recent years, along with high functionality, high speed operation, and large storage capacity of a semiconductor memory device, such as DRAM (Dynamic Random Access Memory) and so forth, DDR (Double Data Rate), DDR2, and DDR3 architecture have been introduced to improve significantly data bandwidth of memory input and output.

In order to improve the data bandwidth of memory input and output, it is necessary to increase the amount of data that can be handled, by speeding up memory Read and Write cycles (tRC), by improving the number of parallel operations executed simultaneously in a memory (increasing the number of parallel data lines (I/O lines), or by increasing the number of memory array banks.

As is well known, power P is approximated by Expression (1).

$$n \times c \times f \times V^2 \qquad (1)$$

In Expression (1), n is the number of elements, c is a capacitance (output load capacitance charged or discharged by an element), f is an operating frequency, and V is an operating voltage. Here, the derivation of Expression (1) is outlined. The power P is an average of power consumed when an element charges or discharges the output load capacitance (dynamic dissipation). Assuming that the operating frequency (toggle frequency) is f and the output load capacitance is $C_L$, the power is given by summing the power when element output Vout rises from Low (0V) to High (VDD) and the power when the output Vout drops from High (VDD) to Low (0V), and is approximated as follows (note that tp=1/f).

$$Pd = \frac{C_L}{tp}\int_0^{VDD} V_{out}\, dV_{out} + \frac{C_L}{tp}\int_{VDD}^0 (V_{DD} - V_{out})\, d(V_{DD} - V_{out}) = \qquad (2)$$

$$\frac{C_L V_{DD}^2}{2tp} + \frac{C_L V_{DD}^2}{2tp} = \frac{C_L V_{DD}^2}{tp} = C_L V_{DD}^2 f$$

With n elements, Expression (2) is multiplied by n, and with load capacitance $C_L$ of each element having a common value c, Expression (1) is obtained.

For example, in a case where the data bandwidth (transmission efficiency) is doubled by improving the operating frequency f, the power also increases. With regard to a memory cell array, lower power consumption is desired at the same time as improvement data amount.

It is to be noted that Patent Document 1 discloses a memory system that supports multiple memory access latency time. FIG. 1 shows a configuration of a system disclosed in Patent Document 1 (cited from FIG. 2A of Patent Document 1). The configuration controls access to a memory device in the memory system. A division is made into a memory device group (latency time group 1) near a memory controller 202 and a memory device group (latency time group 2) distant from the memory controller 202. By sorting data that is frequently accessed and data that is not frequently accessed into group 1 and group 2, respectively, overall access latency is reduced.

FIG. 2 is a diagram representing a general memory configuration in a case where the configuration of FIG. 1 is replaced by a general DRAM (FIG. 2 is a diagram of a reference case made by the inventor of the present application).

As shown in FIG. 2, the memory (DRAM core) includes a memory cell array 1 having a plurality of memory cells in an array form, a row decoder (X DEC) 2 that decodes a row address and activates a selected word line, a column decoder (Y DEC) 3 that decodes a column address and switches on a Y switch of a selected column (bit line), a sense amplifier/Y-switch 4 that amplifies the potential of a bit line, a data amplifier/write amplifier (Data Amp/Write Amp) 5 that amplifies read data amplified by a sense amplifier of a selected column, outputs amplified read data to an RWBS (read/write bus), and drives write data from the RWBS (read/write bus), an address command timing controller 6 that controls address, command, and timing, an input output function and data mask (Data I/O, Data Mask) 7 where the input output function inputs data to a memory cell and outputs data from a memory cell, between a data terminal (not illustrated in the drawings) connected to an internal data bus 9, which is an input to a DRAM core, and a read/write bus RWBS, and the Data Mask performs control of a write mask to a memory cell by a data mask signal from a data mask terminal (not illustrated), input (clock, address, command) 8 to the DRAM core; and the Internal Data Bus 9 that performs input of data to, and output of data from, the DRAM core.

FIG. 3 is a diagram for describing FIG. 2, and is a diagram showing an example of an arrangement (layout) of FIG. 2 (FIG. 3 is a diagram made by the inventors of the present application). In FIG. 3, an area 10 in the memory cell array 1 represents an active area including a memory cell that is to be accessed. Reference number 11 indicates a memory cell array or a memory macro (a circuit block used in a system LSI or the like), forming a basic unit. By controlling the basic unit 11 of the memory cell array by an ADDRESS/CMD BUS connected in common to basic units 11 of the memory cell array, the address command timing controller 6 selects the active area 10 that is to be accessed. Data (Write data/Read data) are input and output from the data I/O unit (Data I/O) 7, and are transferred by a read/write bus (RWBS) that is a bidirectional data bus in common connected to the plural memory cell array basic units 11. Although not limited thereto, in FIG. 3, there are 36 data terminals (DQ terminals) connected to the Internal Data Bus 9 forming data input of the DRAM core. Plural hit data (4 hits corresponding to a burst length) of respective data terminals are converted to parallel data in the data IO unit (Data I/O) 7, and are transferred to the read/write bus (RWBS). The read/write bus (RWBS) extends over the plural memory cell array basic units 11, and is connected in common to a data amplifier (Data Amp)/write amplifier (Write Amp) of each of the memory cell array basic units 11.

As an IO configuration in an array, there is adopted a hierarchical configuration (Local IO/Main IO), or a nonhierarchical configuration. In a case of the hierarchical configuration, the Main that is connected to a data amplifier/write amplifier (Data Amp/Write Amp) 4 is connected to a plurality of Local IOs via a switch circuit, which is not illustrated, and each Local IO is selected by the column decoder (Y DEC) 3 and is connected to a bit line of a selected column via a Y switch 5 that is in an ON state.

In a read operation, data read from a memory cell having a word line set to High is amplified by a sense amplifier 5, transmitted to a Local IO line via the Y switch 5, which is in an ON state, and furthermore is transmitted to the data amplifier (Data Amp) 4 via a Main IO line, and output to an RWBS. In the data IO unit 7, parallel data (data corresponding to burst length) is converted into serial data, and is output from a data terminal to the Internal Data Bus 9 in synchronization with a clock. In the DDR configuration, data is transferred in synchronization with rising and falling edges of a clock signal.

In a write operation, bit data serially supplied from a data terminal connected to the Internal Data Bus 9 is made parallel in the data IO unit 7, transferred to the RWBS, amplified by the write amplifier (Write Amp) 4, and transmitted to a bit line of a selected column with the Y switch 50N, via the Main IO line and selected Local IO line.

Data is controlled by the address command timing controller 6, and is read/written the active area 10 in the selected memory cell array 1.

FIG. 4 is a diagram showing a case 1 (active area 10-1) with a distant side selected, and a case 2 (active area 10-2) with a near side selected, as seen from the address command timing controller 6 and the data IO 7 in FIG. 3.

FIG. 5 is a timing chart (the diagram was made by the inventors of the present application) showing access operation in each of case 1 and case 2 of FIG. 4. For a command (CMD) and a clock (memory CLK), in case 1 and case 2, FIG. 5 schematically shows relationships of α, θ, β, and control delay corresponding to the active areas 10-1 and 10-2 (10-1 control delay, 10-2 control delay) from command input, selection time of the active areas 10-1 and 10-2 (10-1 selection time, 10-2 selection time), and output delay corresponding to the active areas 10-1 and 10-2 (10-1 output delay, 10-2 output delay).

α is tRC (Row Cycle time),
β is tRRD (Row to Row Delay),
γ is control delay/data delay (output delay), and
θ is read latency.

The γ includes setting time (control delay) of address/command and data for controlling an active area 10 of the memory cell array by the address command timing controller 6 and the data IO 7, and delay time for transferring data to a memory cell basic unit via the RWBS.

α is cycle time related to a memory cell array operation of an active area.

β is time from input of one command (CMD) to when a subsequent command (CMD) can be input.

θ is the number of clocks (latency) from input of a Read command until data is output to a data terminal.

As shown in FIG. 5, α>>γ, that is, α is much longer than γ.

Furthermore, in α to θ, α has a time period approximately is equivalent to latency.

Increasing data bandwidth and improving memory cycle are synonymous with improving the latency θ.

In the example of FIG. 5, the ratio (time ratio) of γ to α is small. Therefore, delay of γ (control delay/output delay) and power consumed in γ (control delay/output delay) are small in comparison to the delay and power of α. However, if the number of parallel IO lines in the memory cell array increases, the ration of γ to α becomes large and the power consumed by γ becomes large, due to increase in time and the like for parallel conversion of bit data serially input from the data terminal, for example.

Heretofore, the development of a memory architecture has been made to reduce α and β.

α=tRC (row cycle time) is an index indicating a cycle time during which the memory array actually operates to access a memory cell.

The operating frequency f of memory input and output is determined according to the number of data for which Read/Write is performed (the number of memory cells to be accessed), in a period of one tRC.

[Patent Document 1]
JP Patent Kohyo Publication No. JP2008-500668A

SUMMARY

The entire disclosure of Patent Document is incorporated herein by reference thereto. An analysis of related technology is given as follows.

In a required specification for a memory, latency is important, but in recent years, while tRC (row cycle time) is improved and the number of data access operations (efficiency) of writing to and reading from a memory cell is increased, there is a demand to reduce power, that is, to realize low power while increasing the number of data access operations by reduction of tRC (row cycle time).

FIGS. 6A and 6B are diagrams schematically showing a write operation and a read operation with respect to the memory. It is to be noted that FIGS. 6A and 6B are diagrams made by the inventor of the present application, in order to describe problems. It is also to be noted that in an example shown in FIG. 6A and FIG. 6B, the burst length (the number of data that can be continuously input/output)=4, and BL0-BL3 represents four bit data for consecutive four-column Read/Write, by one access command. In FIGS. 6A and 6B, CMD is a Write command or a Read command. It is to be noted that a bank active command and pre-charge command are omitted. By input of a Write command or a Read command, writing or reading is performed of four bit data BL0-BL3 for four columns with a specified head column address for a specified row address.

In FIG. 6A, 4 bit Write data BL0, BL1, BL2, and BL3 supplied bit-serially from an internal data bus 9 are input from one data terminal at a double data rate (two bit data in a one clock cycle in synchronization with a memory CLK rising edge and falling edge). The input four bit data BL0, BL1, BL2, and BL3 undergo serial to parallel conversion, and, as four bit parallel data (corresponding to a control delay of γ), are transferred in parallel to an RWBS (control delay of γ). Data (bit data for which a data mask is not specified) arriving at a basic unit 11 of a memory cell array from the RWBS is amplified by a Write Amp, and is transferred to a bit line of a selected column for which a Y switch is ON, via a Main IO line and Local IO line, and writing of data is performed to a selected cell of an active area (selection time period).

As shown in FIG. 6A, a control delay (10-1 control delay) for an active area 10-1 of the memory cell array basic unit 11 at a far end from a data IO unit 7 side requires more time than a control delay (10-2 control delay) for an active area 10-2 of the memory cell array basic unit 11 at a near end to the data IO unit 7 side. It is to be noted that in FIG. 6A, BL0-BL3 under control delay are parallel four bit data obtained by serial parallel conversion of four bit data serially input from a data terminal, and BL0-BL3 under the 10-2 selection time are parallel four bit data output to a selected column from a data amplifier in the memory cell array basic unit 11.

FIG. 6B is a timing chart describing the operation when data is read from a memory cell with the burst length=4. The control delay (10-1 control delay) for the active area 10-1 located at the far end from the data IO unit 7 side requires more time than the control delay (10-2 control delay) for the active area 10-2 located at the near end to the data IO unit 7 side. With regard to selection time (selection time of the active areas 10-1 and 10-2) in FIG. 6B, four bit data read to the Local IO line are converted into serial data by the data IO unit (Data IO), with respect to output delay (output delay for the active areas 10-1 and 10-2), and from timing of the end of the output delay γ, the four bit data BL0-BL3 are serially output at a double data rate.

In Write and Read operations, a characteristic is determined by selection of a memory cell (memory cell of an active area) at a far end from the data IO unit 7 side, and a time period β between a command (CMD) and a subsequent command (CMD) is 3 cycles. A selection time period of an active area of the memory cell array is determined as tRC=α=3 cycles.

In an example shown in FIG. 5, α>>γ, but as shown in FIG. 6, in a high speed memory, the ratio of γ to α or θ is large. That is, the ratio of a delay 1 (Data IO line or control signal line delay: γ) of data transfer in the memory cell array is large.

In particular, in a high speed memory in which importance is attached to the reduction of α(=tRC), the delay 1 (γ) appears large with respect to a delay 2 (α) of a memory operation in which a word line/a bit line in a memory array are selected and a memory cell is selected.

Therefore, it becomes necessary to realize efficient transfer of data input from a data terminal through a data input/output line to perform Write/Read access to the memory cell, and reduction of power consumption.

FIG. 7 is a diagram describing related technology (a diagram made by the inventor of the present application in order to describe problems). In FIG. 7, the number of data terminals (connected to an internal data bus 9) is 36, burst length=4, and a read/write bus RWBS includes 4 bit×36=144 data lines. Active areas in a memory cell array basic unit 11 are indicated by 10-1 and 10-2. It is to be noted that in FIG. 7, a ROW decoder (X DEC) is not illustrated. COL DECODER is a column decoder (Y DEC) that decodes a column address. In FIG. 7, elements that are the same or equivalent to those in FIG. 3 and FIG. 4 are given the same reference symbols. It is as a matter of course that the COL DECODER is arranged inside a memory cell array basic unit as in FIG. 3 or FIG. 4.

FIG. 8 and FIG. 9 are timing charts describing Write and Read operations in the arrangement of FIG. 7. As shown in FIG. 8, in a consecutive Write operation in which Write commands are consecutively input with no spare time therebetween, four bit data BL0-BL3 are input to a data terminal in synchronization with a rising edge and a falling edge a clock in two clock cycles from a first Write command (CMD), and with a control delay of γ, the four bit data BL0-BL3 are supplied to a Write Amp of a memory cell array basic unit via the RWBS as parallel data. In a selection time following a control delay, writing is performed to a memory cell which is connected to a selected word line and connected to a bit line of a selected column. In an example in FIG. 8, α is a 3 clock cycle. Four bit data corresponding to a subsequent command at 2 cycles after a delay α for four bit data input in response to a previous command are input serially from a data terminal. A control delay of a far end access area extends more than a control delay of a near end access area. In FIG. 7, a pipeline 8 designates processing of control delay and processing of selection time thereafter.

As shown in FIG. 9, in a consecutive Read in which a Read command is consecutively input with no spare time therebetween, four bit data are output from a data terminal in synchronization with a rising edge and a falling edge of a clock, after θ from input of a Read command (CMD). The pipeline 1 designates control delay and selection time, and a pipeline 2 designates output delay and output of serial bit data. The control delay and output delay of a far end access area is longer than the control delay and output delay of the near end access area.

In Patent Document 1 discloses an arrangement in which, in order to efficiently perform reading and writing of data, average latency is shortened, by focusing on the delay time of a latency path.

However, with only shortening of the average latency, the memory access cycle itself cannot be reduced. Furthermore, this is not sufficient for reducing power consumption.

Therefore, it is an object of the present invention to provide a semiconductor device having a memory array that allows to achieve reduction of power consumption and fast memory access.

In order to solve at least one of the abovementioned problems, the present invention is configured in outline as follows, bur not limited thereto.

According to the present invention, there is provided a semiconductor device comprising:

a memory cell array made up of a plurality of basic units, each of the plurality of basic units including a plurality of memory cells, data being able to be written and read to and from each of the plurality of memory cells;

a first bus that is arranged in common for the plurality of basic units of the memory cell array and that transfers write and read data to and from each of the plurality of basic units;

a second bus that is arranged in common for the plurality of basic units of the memory cell array and that transfers an address/command to each of the plurality of basic units;

a plurality of first buffer circuits, each of which is arranged in correspondence with each of the plurality of basic units of the memory cell array and receives an address/command transferred by the second bus to supply the address/command to the each of the plurality of basic units, an address/command control unit that generates an address/command responsive to each of write and read commands; and a data input/output control unit that sends write data to the first bus and receives read data from the first bus.

Each of the plurality of basic units of the memory cell array includes:

a first amplifier that receives write data which is to be written to a memory cell and is transferred on the first bus and amplifies the write data; and a second amplifier that amplifies read data from a memory cell and outputs the amplified read data to the first bus.

There are first to third time periods each constituting a unit period for pipeline control, wherein said first time period includes a control delay in which an address/command to be transferred to said second bus is generated by said address/command control unit in response to each of write and read commands, and in which write data to said first bus is prepared by said data input/output control unit in response to said write command, said second time period includes a selection time in which in said basic unit of said memory cell array, writing to a selected memory cell for said write command or reading from a selected memory cell for said read command is performed, and said third time period includes an output delay in which said data input/output control unit receives read data transferred on said first bus and outputs said read data to a data terminal, said read data being output to said first bus by said second amplifier in said selection time associated with said read command, said first time period having a length greater than or equal to said second time period.

According to the present invention, it is possible to realize a semiconductor device provided with a memory array that enables power reduction and reduction of memory access.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 3 is a diagram for describing related technology.

FIG. 4 is a diagram for describing related technology.

FIG. 5 is a timing chart of related technology.

FIG. 6A and FIG. 6B is a diagram for describing problems of related technology.

PREFERRED MODES

Figure 1:
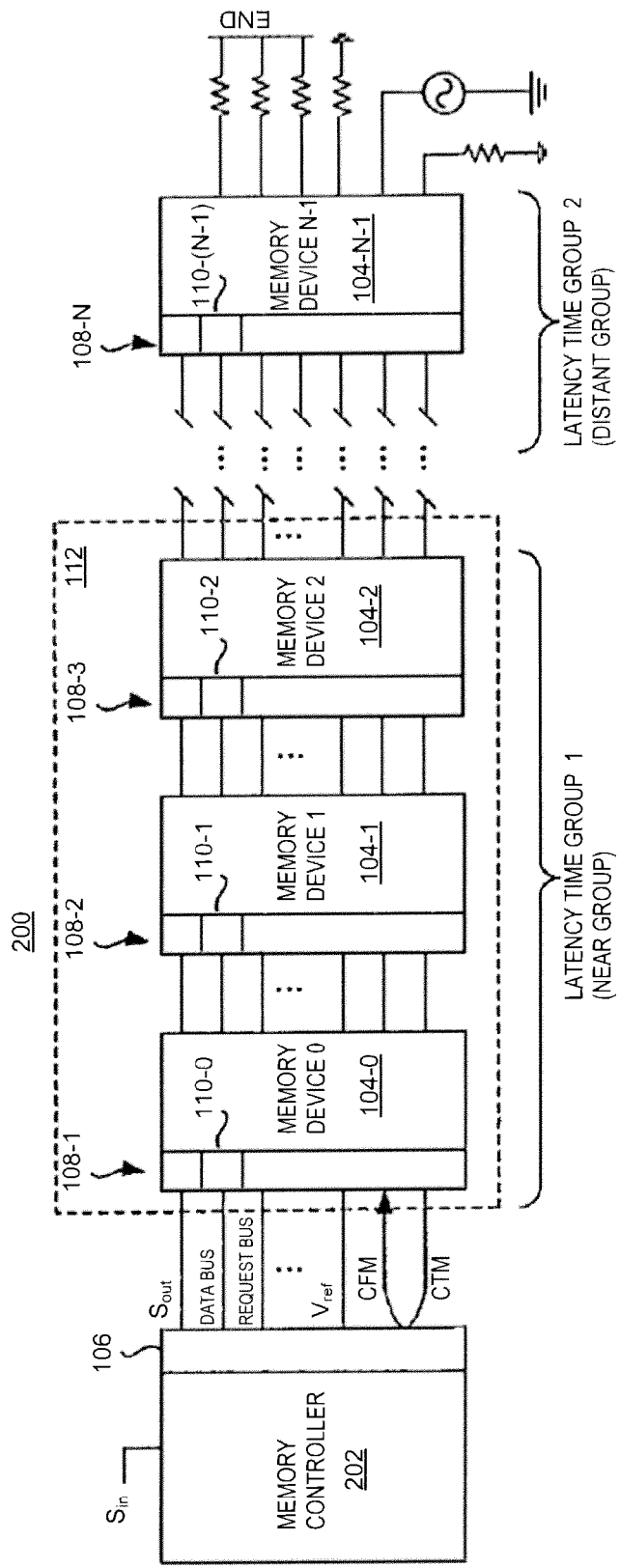
FIG. 1 is a diagram showing a configuration of Patent Document 1.
Figure 2:
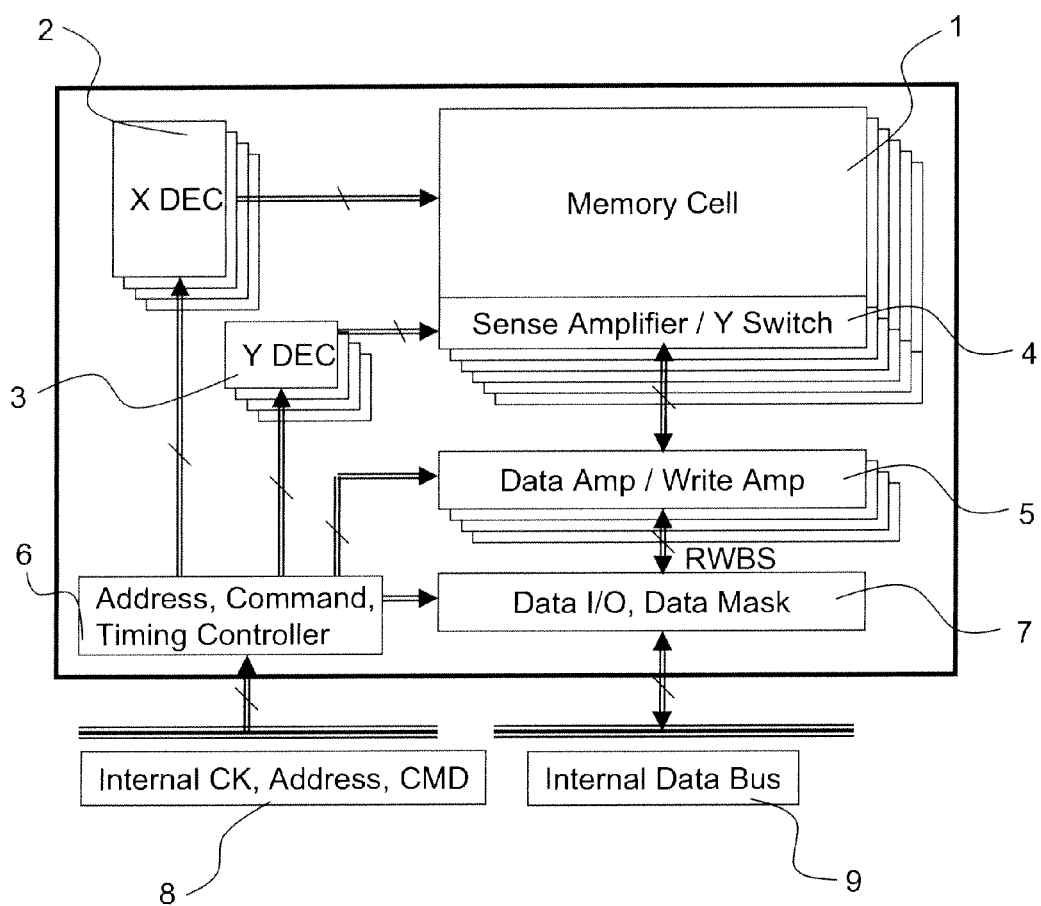
FIG. 2 is a diagram showing a configuration of a general memory.

A description is given concerning exemplary embodiments of the present invention, making reference to the drawings. First, a description is given concerning an operating principle of the present invention.

The following described power delay product (=P×Td). As described above, the power P is determined as follows.

$$n \times c \times f \times V^2$$

where n is the number of elements, c is capacitance, f is operating frequency, and V is operating power supply voltage. The power delay product (=P×Td) is expressed as follows, when divided into delay 1 such as control delay/output delay and delay 2 such as selection time.

$$P \times T_d = n_1 \times c_1 \times f_1 \times V_1^2 \times T_{d1} + n_2 \times c_2 \times f_2 \times V_2^2 \times T_{d2} \qquad (3)$$

In Expression (3), subscript 1 represents a component of delay 1 (serial parallel conversion of data IO, and control delay γ of a control signal line), and subscript 2 represents a component of delay 2 (cycle α).

When considering items that can be traded off for power reduction, in view of data efficiency from a system perspective, it is not possible or not allowed to reduce the number of data output from memory or input to memory.

In a read operation, γ is a delay (control delay) from a Read command input until address/command is given to a memory cell array basic unit, or is a delay (output delay) until a Data IO unit, that receives four bit parallel data transferred from a memory cell basic unit 11 to an RWBS, converts the data into serial bit data to output the bit data from a data terminal. The number of data bits read from memory does not change (burst length). For example, in a case of consecutive read commands or the like, if data is once output to a data terminal, since data efficiency is determined by α (=tRC), there is a possibility that γ can be negligible in the system. For example, without considering time shortening of γ, even if the time thereof is elongated, it may be possible to avoid lowering data efficiency by making α shorter.

Under a condition that the power delay product P×Td is constant, if the power P is reduced, it may be possible to allow the delay Td to be extended (for example, the time of γ in delay 1). The power delay product P×Td may be considered to correspond to data efficiency.

Regarding delay 1, by reducing operating frequency $f_1$ or operating voltage $V_1$ of a power component $$n_1 \times c_1 \times f_1 \times V_1^2$$

It is possible to reduce the power P. The power P and the delay Td have a mutual tradeoff. Therefore, when the power P is halved, for example, it is necessary that the delay Td does not increase by two times or more.

It is required that the delay 2 (cycle α) that determines the number of input/output data of the memory cell array be made constant or be further shortened.

In the present invention, focusing on the control delay (output delay) γ, a pipeline architecture is implemented in the memory cell array, and average latency for a memory cell is traded off to realize reduction of power consumption. That is, by shortening the cycle (α) of memory access and elongating the control delay/output delay γ, a reduction in power consumption is realized.

In the present invention, the cycle (α) is reduced by pipelining a delay path to near and far ends of an access path from an address/command controller or data IO unit to a memory cell, and reducing or minimizing a path that determines a cycle of the memory cell.

In Patent Document 1 as described above, β is reduced, whereas in the exemplary embodiments, by making a tradeoff between power P and γ (latency θ) of delay 1, the power is reduced while maintaining or shortening a time period of the cycle α.

In one of preferred modes of the present invention, a memory cell array includes: a plurality of basic units (11), a bi-directional first bus (RWBS), arranged in common for the basic units (11) and in which transfer of write data and read data is performed, and a second bus (ADDRESS/CMD BUS) that transfers address and/or command. Also provided are a plurality of first buffer circuits (13) that are arranged in correspondence with the respective plural basic units (11) of the memory cell array, each of which receives address and/or command transferred to the second bus (ADDRESS/CMD BUS), and that supplies the address and/or command to the basic unit (11). The basic unit (11) includes a first amplifier (Write Amp) that is connected to the first bus (RWBS) and that amplifies data to be written to a selected memory cell, and a second amplifier (DATA Amp) that amplifies data read from a selected memory cell.

In one of modes of the present invention, the following respective time periods are units of pipeline control:
(A) a first time period (γ) that includes a control delay for generating, for write access and read access, an address/command to be transferred to the second bus (ADDRESS/CMD BUS), and for preparing write data to the first bus (RWBS) for write access;
(B) a second time period (α) that includes a selection time in which writing of data to a selected memory cell and reading from a selected memory cell are performed in the basic unit of the memory cell array; and
(C) a third time period (γ) that includes an output delay for outputting, in read access, data to a data terminal, which has been output to the first bus (RWBS) by a read operation in the selection time.

In one of modes of the present invention, the first time period is set to a length equal to or more than that of the second time period (γ=α, or γ>α). Furthermore, the third time period is set to a length equal to or more than that of the second time period (γ=α, or γ>α).

In related technology, as shown in FIG. 5 and FIG. 6, γ is included in α. On the contrary, according to one mode of the present invention, γ is took out from α of the related technology and a first time period (γ) is defined. A time period obtained by subtracting γ from α of the related technology, is defined as a second time period (α). The first time period (γ) is extended and the second time period (α) is shortened. With each of these time periods as a unit of pipeline control, efficiency of access to memory is improved (for example, the second time period (α) for one command and the first time period (γ) of a subsequent command overlap in time), and power reduction is realized.

In one of modes of the present invention, the first time period (γ) and the third time period (γ) are both set to the same length as the second time period (α).

In another mode of the present invention, the first time period and the third time period are set to a time longer than that necessary for the control delay and the output delay.

In one mode of the present invention, a time period, during which, in writing, plural items of data are serially input from a data terminal, and a time period, during which, in reading, plural items of data are serially output from a data terminal, are set to the same length, as the second time period (α). The plural items of data correspond to a burst length which is the number of data items that can be accessed by one command.

In one mode of the present invention, there is provided a data input output unit (DATA 10), in which plural items of data input serially from the data terminal are converted into parallel data to be transferred in parallel to the first bus, and the plural data transferred in parallel to the first bus are converted into serial data to be output from a data terminal.

In one mode of the present invention, by extending the first and third time periods (γ), it is possible to extend latency (θ) in a case of read access, and to reduce power consumption.

In one mode of the present invention, there is provided, in the first bus (RWBS), at least one buffer circuit (13A) between a basic unit located on a side far from, and a basic unit located on a side close to, a data input output unit (DATA IO) that inputs and outputs data to and from the first bus (RWBS).

In one mode of the present invention, at least one buffer circuit (13B) is provided between the basic unit located on a side far from, and the basic unit located on a side close to, an address command timing controller 6 that outputs an address/command to the second bus (ADDRESS/CMD BUS).

In one mode of the present invention, in the first bus (RWBS), there may be arranged the buffer circuit (13A) between adjacent basic units (11).

In one mode of the present invention, in the second bus (ADDRESS/CMD BUS), there may be arranged the buffer circuit (13B) between adjacent basic units (11). The following describes exemplary embodiments.

First Exemplary Embodiment

Figure 7:
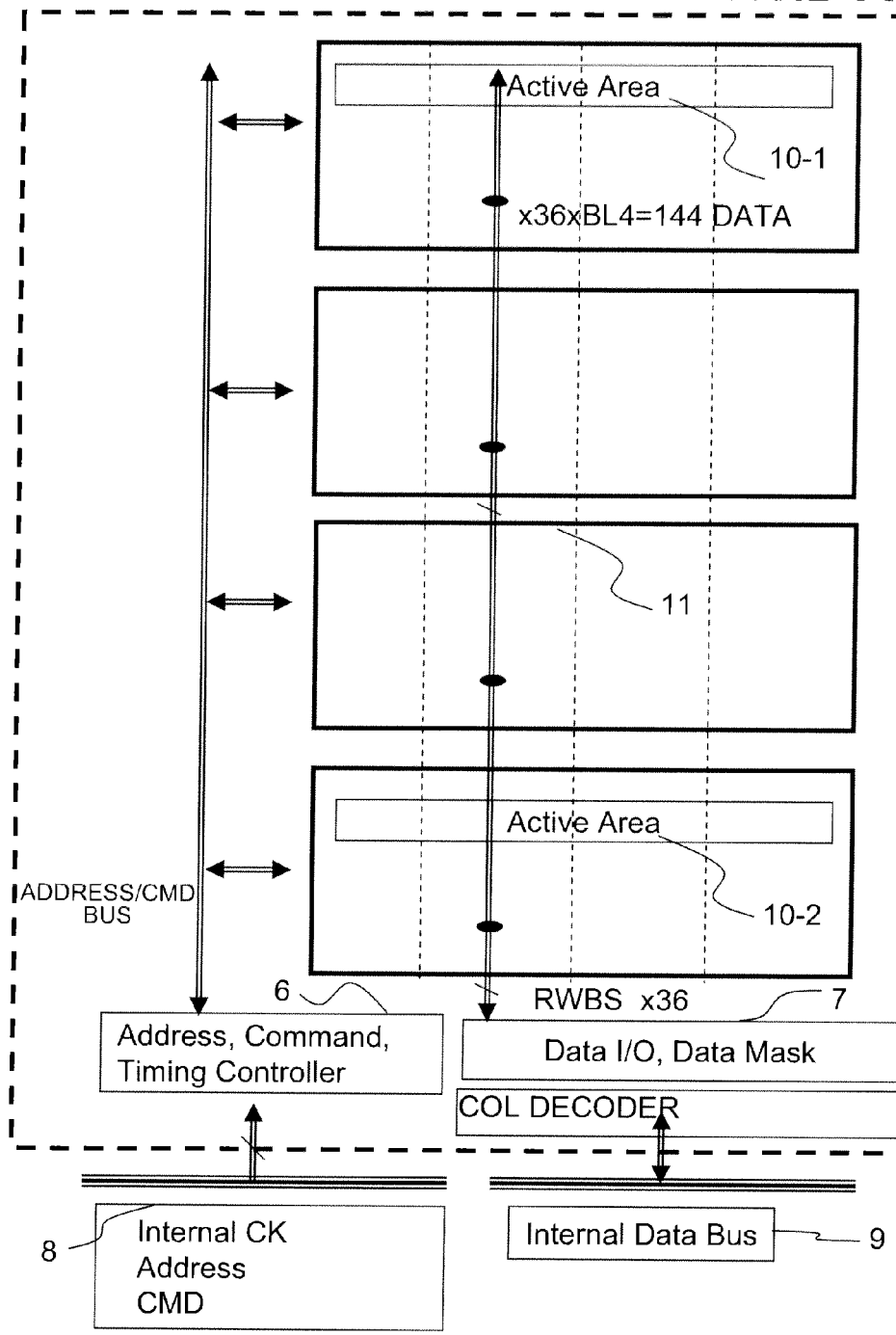
FIG. 7 is a diagram for describing related technology.
Figure 10:
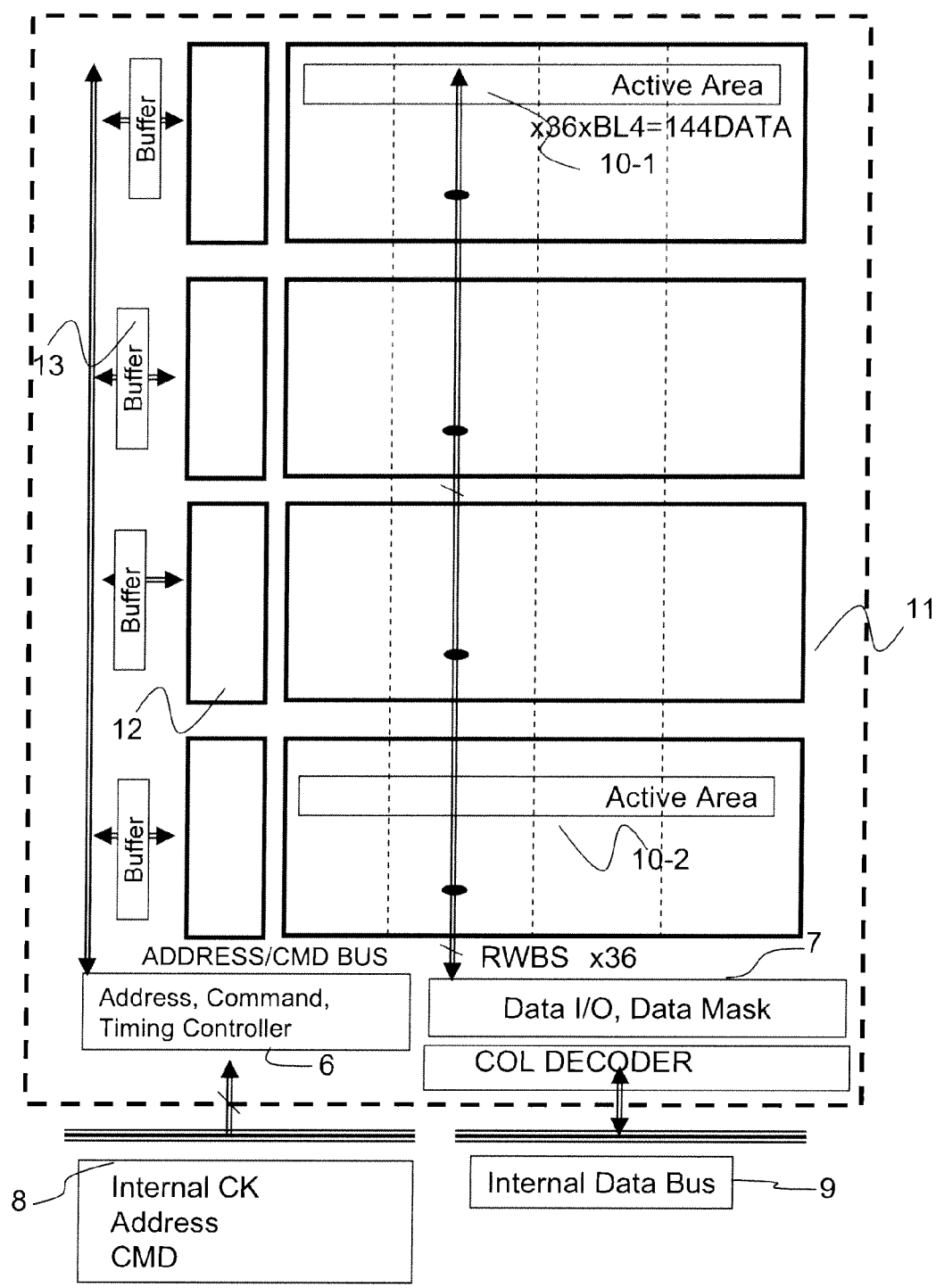
FIG. 10 is a diagram for describing a first exemplary embodiment of the present invention.

FIG. 10 is a diagram showing an arrangement of an exemplary embodiment of the present invention. In FIG. 10, elements that are the same or equivalent to those in FIG. 7 are given the same reference symbols. The following describes the points of difference from related technology of FIG. 7.

The memory array is divided into plural arrays to be adapted to a pipeline synchronized with a clock. The array control signal such as an address, command, timing signal or the like, and the data bus (RWBS) are divided with a clock signal CLK as a reference to be subjected to pipeline control. Therefore, the row cycle time (α) is shortened. As shown in FIG. 10, a bidirectional address/command buffer 13 connected to an address/command bus (ADDRESS/CMD BUS), and an address/command sub controller 12 that receives output (address, command, timing signal) of the address/command buffer 13 and controls a basic unit 11 of a memory cell array, are arranged to correspond with the basic unit 11 of the memory cell array. The address/command buffer 13 constitutes a pipeline register. The address/command sub-controller 12 receives an address and command held in the buffer 13, and outputs the address and command to the basic unit 11 of the memory cell array. An address command timing controller 6, similar to FIG. 7, receives an address, command, and internal clock from an internal clock address command generation unit 8, and outputs an address command timing signal to an ADDRESS/CMD BUS. It is to be noted that in an example of FIG. 10, the address/command buffer 13 is a bidirectional buffer, but in a case of a buffer configuration that is unidirectional (from the address command timing controller 6), a configuration as shown in FIG. 21B may be used.

Figure 11:
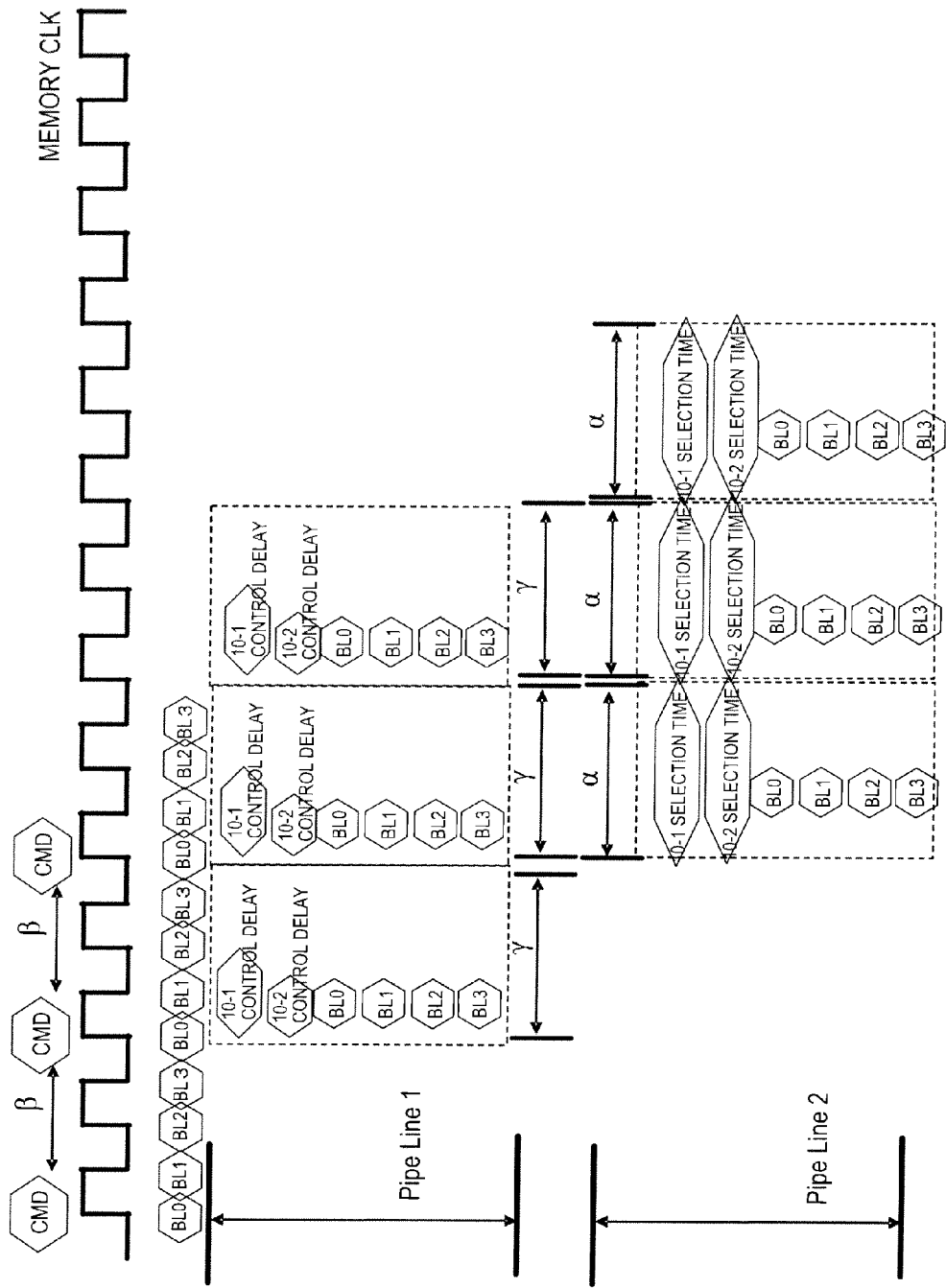
FIG. 11 is a timing chart for describing consecutive Write operations in the first exemplary embodiment of the present invention.

An example shown in FIG. 11 is a two-stage pipeline configuration where α=β=γ, and the diagram shows an example of allocation of Write timing.

α=tRC (Row Cycle)

β=tRRD (Row to Row Delay)

γ=control delay

As shown in FIG. 11, in the present exemplary embodiment, an operation period of the address/command sub-controller 12 of FIG. 10 is elongated so that γ is equal to α (a low speed operation of γ=α).

Figure 8:
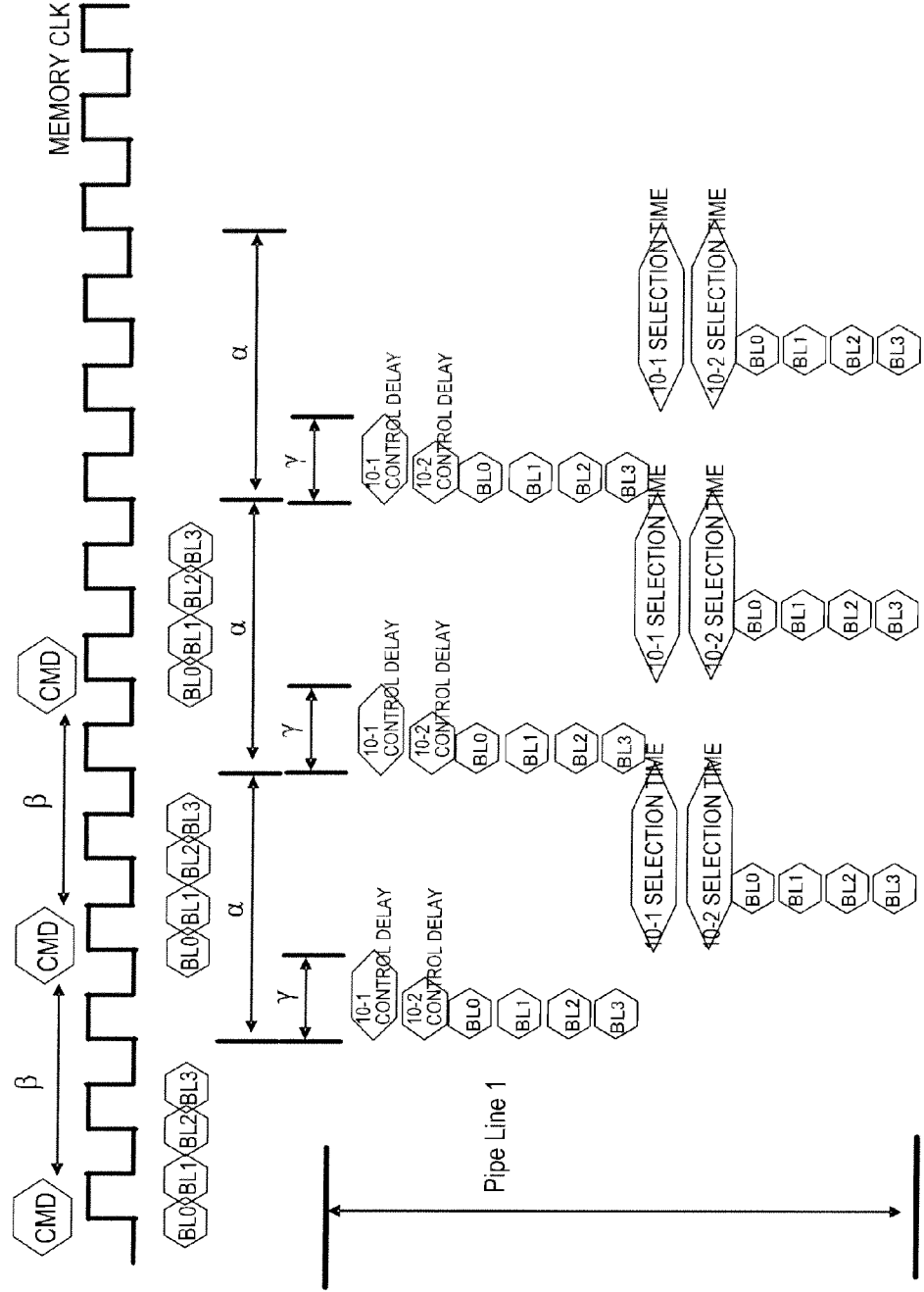
FIG. 8 is a timing chart for describing a Write operation of related technology.
Figure 9:
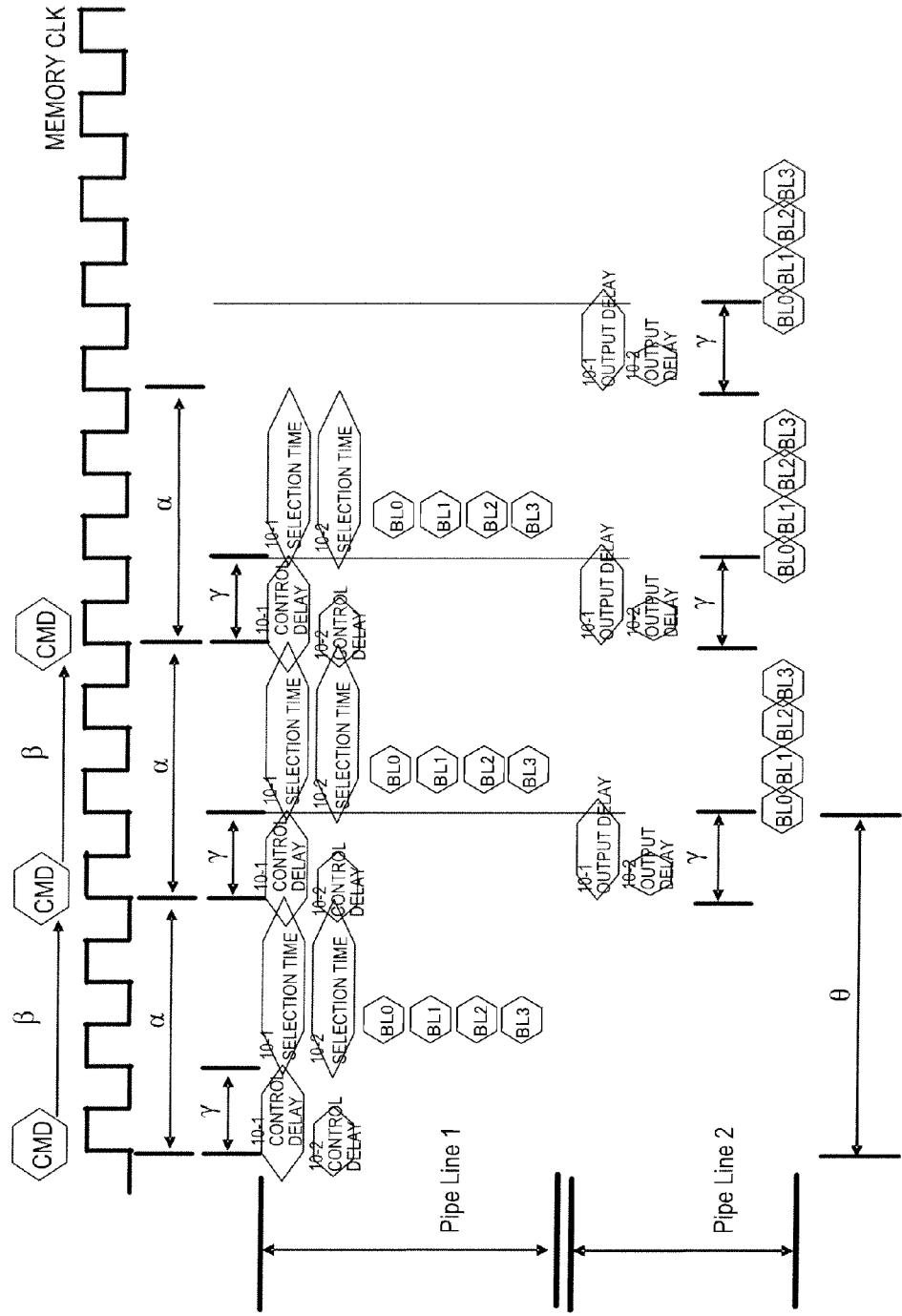
FIG. 9 is a timing chart for describing a Read operation of related technology.

In the related technology described making reference to FIG. 7 to FIG. 9, the following held:

$$\gamma \ll \alpha$$

Contrary to this, in the present exemplary embodiment, the time period of γ is elongated (equal to two clock cycles), as follows.

$$\gamma = \alpha$$

Four bit data BL0-BL3 corresponding to a burst length of 4 is input with two clock cycles at a double data rate, in response to input of Write command (CMD). In subsequent third and fourth clock cycles corresponding to a γ control delay, the address decoding, serial to parallel conversion of the four hit data BL0-BL3, transferring of four bit data BL0-BL3 to a Write Amp of a memory cell array basic unit by an RWBS, are performed. In the third and fourth clock cycles, the four bit data BL0-BL3 corresponding to a subsequent Write command are input from a data terminal (internal data bus 9). The subsequent two clock cycles (fifth and sixth clock cycles) correspond to a selection time of the first input Write command in which data writing to a selected memory cell is performed. The subsequent two clock cycles (fifth and sixth clock cycles) also correspond to a control delay of four bit data corresponding to a second Write command. In these fifth and sixth clock cycles, four bit data BL0-BL3 corresponding to a third Write command are input serially from a data terminal.

Figure 12:
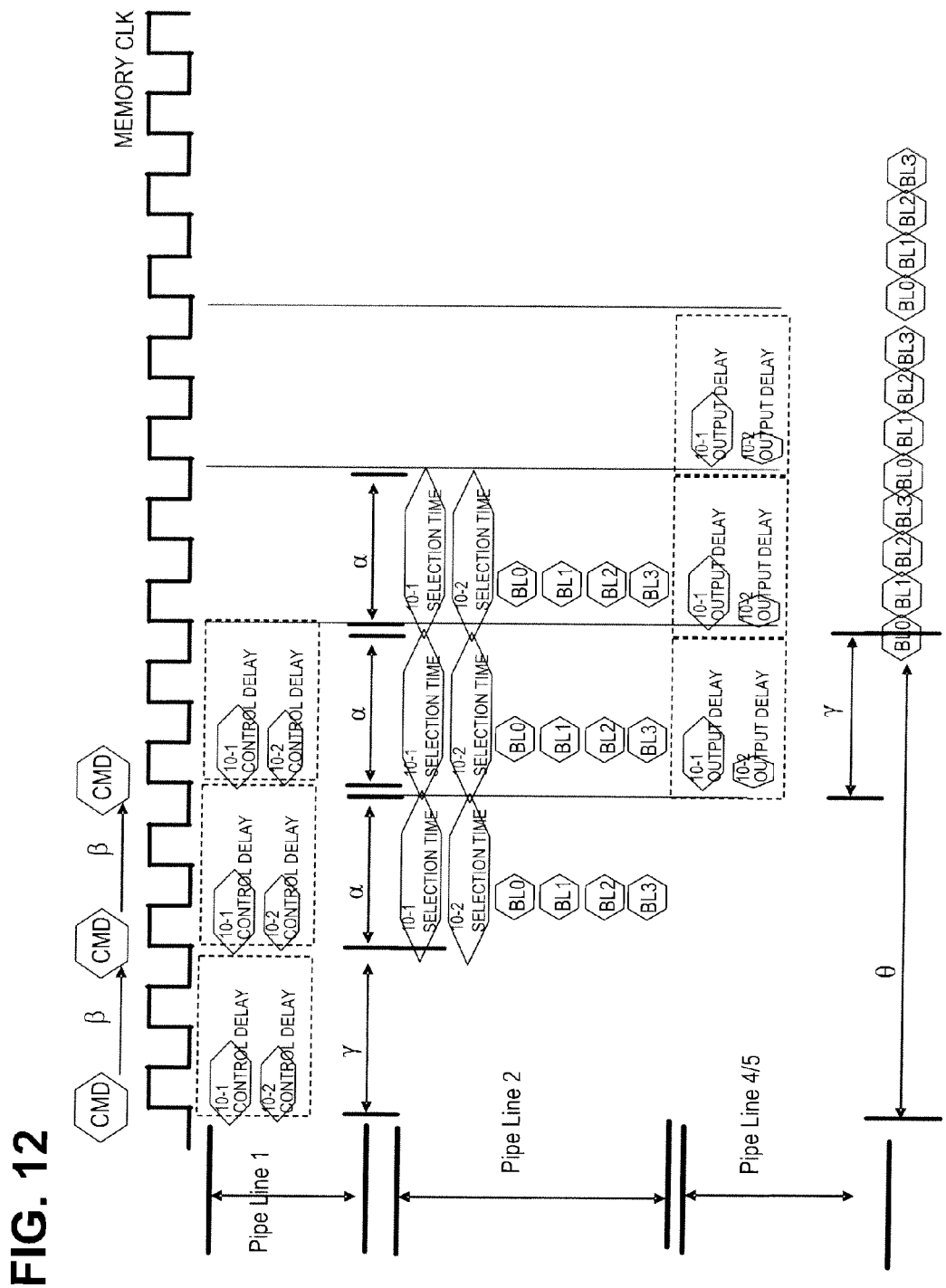
FIG. 12 is a timing chart for describing consecutive Read operations in the first exemplary embodiment of the present invention.

FIG. 12 is a timing diagram describing a Read timing operation for a case where plural Read commands are consecutively input. In FIG. 12, α is tRC (Row Cycle time), β is tRRD (Row to Row Delay), γ is control delay/output delay, and θ is Read latency. Referring to FIG. 12, after two clock cycle time period (including the control delay γ) for a first Read command (CMD) input, a time period of the third and fourth clock cycles correspond to a selection time (α), in which output to the RWBS of four parallel bit data from four memory cells of four columns selected is performed.

The fifth and sixth clock cycles correspond to an output delay of the first Read command. In seventh and eighth clock cycles, four bit data BL0-BL3 are output serially from a data terminal in synchronization with a clock rise and fall.

In a time period of the third and fourth clock cycles in FIG. 12, the selection time (α) corresponding to a first Read command and the control delay (γ) of a subsequent second Read command overlap in timing (pipeline control with γ=α).

In a time period of the fifth and sixth clock cycles, control delay of a third Read command, selection time of a second Read command, and output delay of the first Read command overlap in a timing (pipeline control with γ=α).

In a time period of the seventh and eighth clock cycles, selection time of the third Read command, output delay of the second Read command, and output of four bit data BL0-BL3 of the first Read command overlap in timing (pipeline control with γ=α). After six cycles (latency=6 cycles) after the first Read command has been input, the bit data BL0 that has been read from a memory cell is output from a data terminal.

In the related technology shown in FIG. 8 and FIG. 9, γ is 1 cycle, and latency θ is 4 cycles.

On the contrary, in the present exemplary embodiment, as shown in FIG. 11 and FIG. 12, γ increases to 2 cycles and θ increases to 6 cycles.

In the related technology shown in FIG. 8 and FIG. 9, γ is 3 cycles, whereas in the present exemplary embodiment, in FIG. 11 and FIG. 12, α is reduced to 2 cycles.

In the present exemplary embodiment, there is an improvement in filling ratio of BL0-BL3 (input/output data).

In the related technology shown in FIG. 7, in writing, as shown in FIG. 8, there is a gap of one clock cycle (idle cycle) between the last hit data BL3 of the four hit data BL0-BL3 input to a data terminal in response to a Write command (for example, a first Write command), and the first hit data BL0 of the four hit data BL0-BL3 input from a data terminal (internal data bus 9) in response to a subsequent Write command (for example, a second Write command). Furthermore, in reading, as shown in FIG. 9, there is a gap of one clock cycle (idle cycle) between the last hit data of BL0-BL3 output to the internal data bus 9 from the data terminal in response to a Read command (for example, a first Read command), and the first bit data BL0 of the four bit data BL0-BL3 output from a data terminal in response to a subsequent Read command (for example, a second Read command).

On the contrary, in the present exemplary embodiment, as shown in FIG. 11, in consecutive writing, there is no gap (idle cycle) between the last bit data BL3 of the four bit data BL0-BL3 input to the data terminal (internal data bus 9) in response to a Write command (for example, a first Write command), and the fast bit data BL0 of the four bit data BL0-BL3 input to a data terminal in response to a subsequent Write command (for example, a second Write command). Furthermore, in consecutive reading, as shown in FIG. 9, there is no gap (idle cycle) between the last bit data of BL0-BL3 output to the data terminal (the internal data bus 9) in response to a Read command (for example, a first Read command), and the first bit data BL0 of the four bit data BL0-BL3 output from the data terminal (the internal data bus 9) in response to a subsequent Read command (for example, a second Read command). Table 1 below lists the related technology (FIG. 7 to FIG. 9) and the present exemplary embodiment. It is to be noted that in Table 1, α=3 cycles (clock cycles) for Td2 (1/f2) of the related technology and includes a control delay (γ) of 1 cycle (refer to FIG. 8 and FIG. 9). In the present exemplary embodiment, γ is put out of α(=3 cycles), and the selection time (α) is set to 2 cycles.

TABLE 1

|  | Td1 (1/f1) | Td2 (1/f2) | Latency |
| --- | --- | --- | --- |
| Related technology | 1 cycle (=γ) | 3 cycles (=α) | 4 cycles (=θ) |
| Present exemplary embodiment | 2 cycles (=2γ) | 2 cycles (=(2/3)α) | 6 cycles (=(6/4)θ) |

Under the condition that power delay product P×Td is constant, if the delay Td is doubled, the power P can be reduced to ½ (ideally, voltage also reduces to ½). In a case where power consumed in γ (γ power) is made equal to power consumed in α (α power), that is $n_1 \times c_1 \times f_1 \times V_1^2 = n_2 \times c_1 \times f_2 \times V_2^2$, the γ power is ½ that of the related technology, and the delay Td is 3/2 that of the related technology, then the power delay product P×Td in total is reduced to (½)×(3/2)=¾ of the related technology (=a factor of 0.75).

In a case where the γ power is larger than the α power, a reduction effect in the power delay product by a reduction of the γ power is even larger.

An address/command sub-controller 12 and an address/command buffer 13 each functions to provide separation between a delay 1 (γ) and a delay 2 (α) in terms of a circuit arrangement, that is, separation between one or more circuits for the delay 1 (γ) and one or more circuits for the delay 2 (α).

Second Exemplary Embodiment

Figure 13:
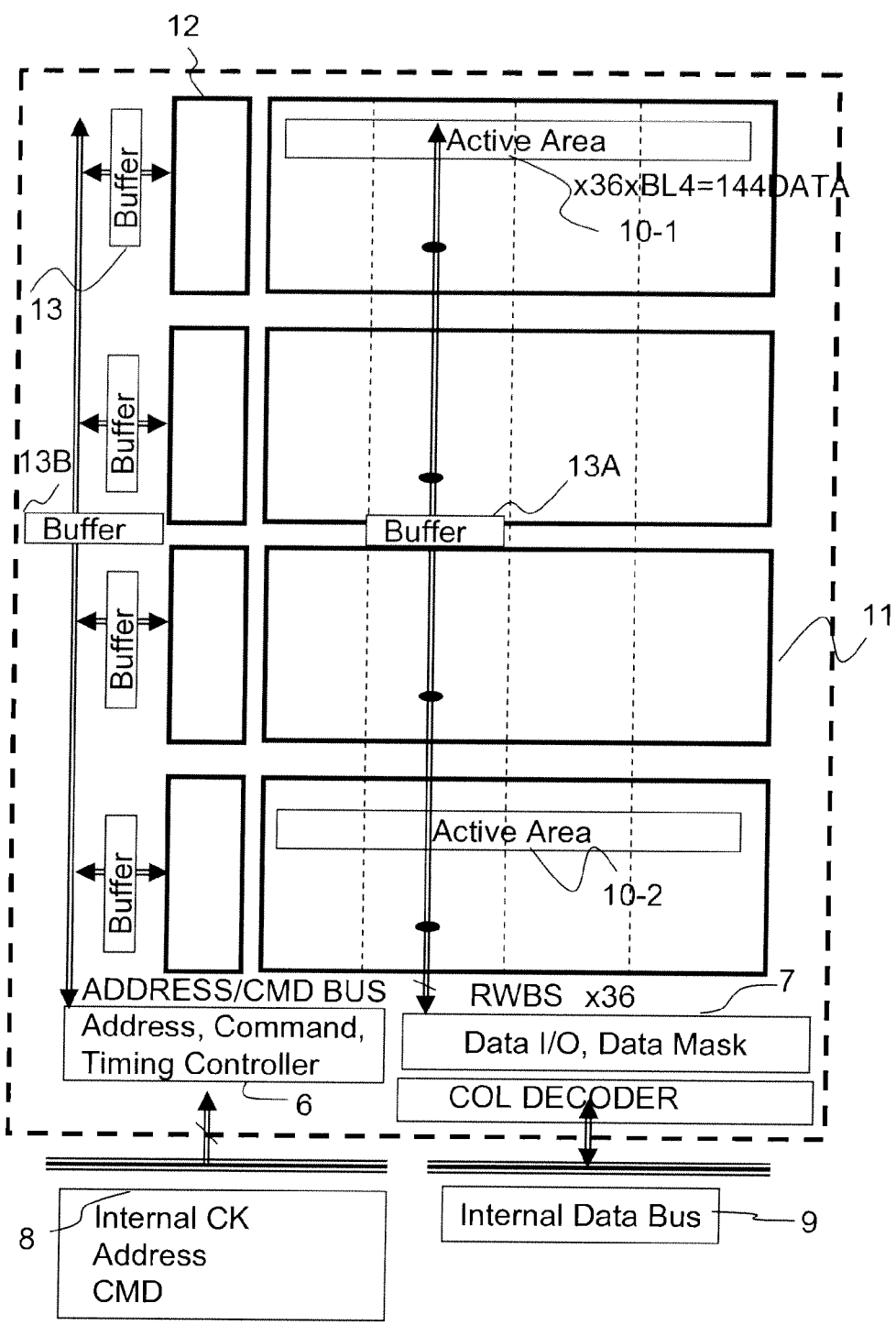
FIG. 13 is a diagram for describing a second exemplary embodiment of the present invention.

FIG. 13 is a diagram showing a configuration of a second exemplary embodiment of the present invention. In FIG. 13, elements that are the same or equivalent to those in FIG. 10 are given the same reference symbols. The following mainly describes points of difference from FIG. 10. Referring to FIG. 13, in the present exemplary embodiment, separation is made into a distant memory cell array basic unit and a near memory cell array basic unit as viewed from an address command timing controller 6 and a data IO unit 7, and a buffer 13B (refer to FIG. 21B) is provided on an address/command bus (ADDRESS/CMD BUS) and a buffer 13A is provided on a read/write bus (RWBS).

Figure 21A:
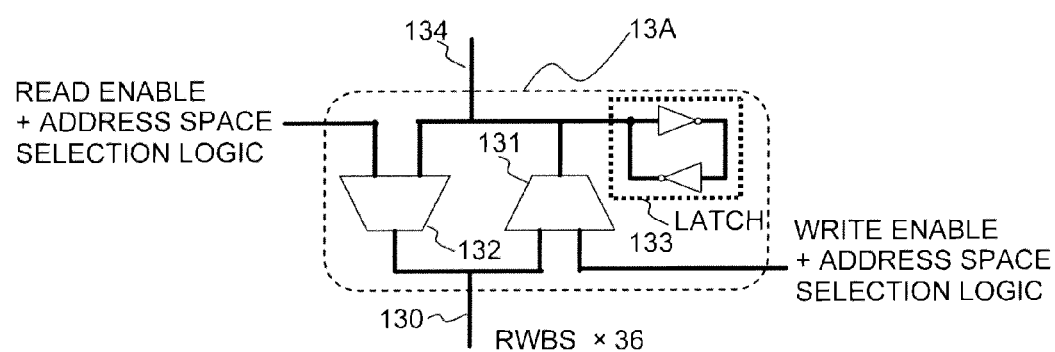
FIGS. 21A and 21B are diagrams showing a configuration of a data buffer and a configuration of an address/command buffer.
Figure 21B:
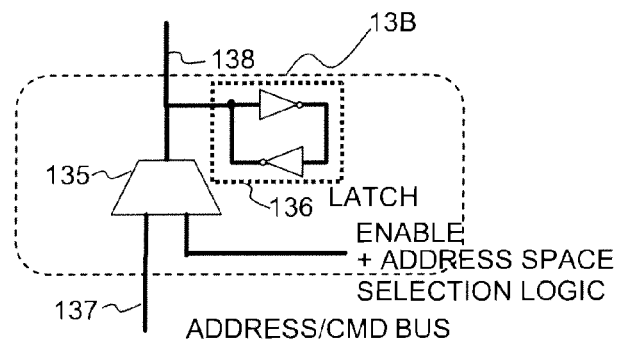

As shown in FIG. 21A, in the data buffer 13A, which is bidirectional, there are provided a first tri-state (3 state) buffer circuit 131 which, when both Write Enable and address space selection logic are active, transfers Write data on RWBS 130 to an RWBS 134, and when at least one of Write Enable or the address space selection logic is in an inactive state, has an output set to an OFF state (Hi-Z), and a second tri-state buffer circuit 132, which, when both Read Enable and the address space selection logic are active, transfers Read data on the RWBS 134 to the RWBS 130, and when at least one of Read Enable or address space selection logic is in an inactive state, has an output set to an OFF state (Hi-Z). Output of the buffer circuit 131 is connected to a latch circuit 133. The latch circuit 133 includes two inverters, each of which has an input connected to an output of the other inverter, and has an output connected to an input of the other inverter. In a case where Write Enable is activated at a time of writing and an address signal corresponds to a memory cell array basic unit connected to the RWBS 134, the address space selection logic is made active. In a case where Read Enable is activated at a time of reading, and an address signal corresponds to a memory cell array basic unit connected to the RWBS 134, the address space selection logic is made active.

As shown in FIG. 21B, a buffer 13B 3 is provided with a tri-state buffer circuit 135, which when both Enable and address space selection logic signal are active, outputs an address/command on an ADDRESS/CMD BUS 137, and when at least one of Enable and address space selection logic is in an inactive state, has an output set to an OFF state (Hi-Z). Output of the buffer circuit 135 is connected to a latch circuit 136. The latch circuit 136 includes two inverters, each of which has an input connected to an output of the other inverter, and has an output connected to an input of the other inverter. In a case where Enable is activated when accessing occurs and the buffer circuit 135 corresponds to a memory cell array basic unit that is to be accessed, both Enable and address space selection logic to the buffer circuit 135 are made active.

In FIG. 13, in a case of an access address (row address) to memory cell array basic units 11 of upper 2 stages located at a far end from a data IO unit 7, the address space selection logic with regard to the buffer 13A is made active. On this occasion, in a case of an access address (row address) to the memory cell array basic units 11 of the upper 2 stages, similar to the buffer 13B inserted to the ADDRESS/CMD BUS, the address space selection logic is made active.

Figure 14:
FIG. 14 is a timing chart for describing consecutive Write operations in the second exemplary embodiment of the present invention.

FIG. 14 is a diagram showing timing at which data is written to the array by a pipeline, in FIG. 13. As shown in FIG. 14, with a control delay γ of 4 clock cycles, four bit data BL0-BL3 corresponding to a burst length of 4 in two clock cycles from input of a first Write command are serially input to a data terminal from an internal data bus 9, address generation according to two clock control delay from a third clock at which a second Write command is input is performed, and output of four bit data in parallel to RWBS is performed. The four bit data corresponding to a second Write command in third and fourth clock cycles is serially input to a data terminal from the internal data bus 9. A third Write command is input at a fifth clock, the four bit data corresponding to the third Write command at the fifth and sixth clock is serially input to a data terminal from the internal data bus 9, and the four bit data corresponding to the second Write command in parallel are output of to the RWBS. On this occasion, the four bit data is input to a Write Amp of a memory basic unit 11 corresponding to the first Write command, or held in a data buffer 13 and input to a Write Amp of a memory basic unit 11 at a far end. By a pipeline operation with the data buffer 13 inserted on the RWBS, γ is extended from two clock cycles to four clock cycles. The four bit data BL0-BL3 corresponding to the first Write command is transferred to a bit line of a selected column in the memory cell array basic unit 11 at a seventh clock (after 6 clock cycles from the first Write command input), and writing of data into a selected memory cell is performed.

Figure 15:
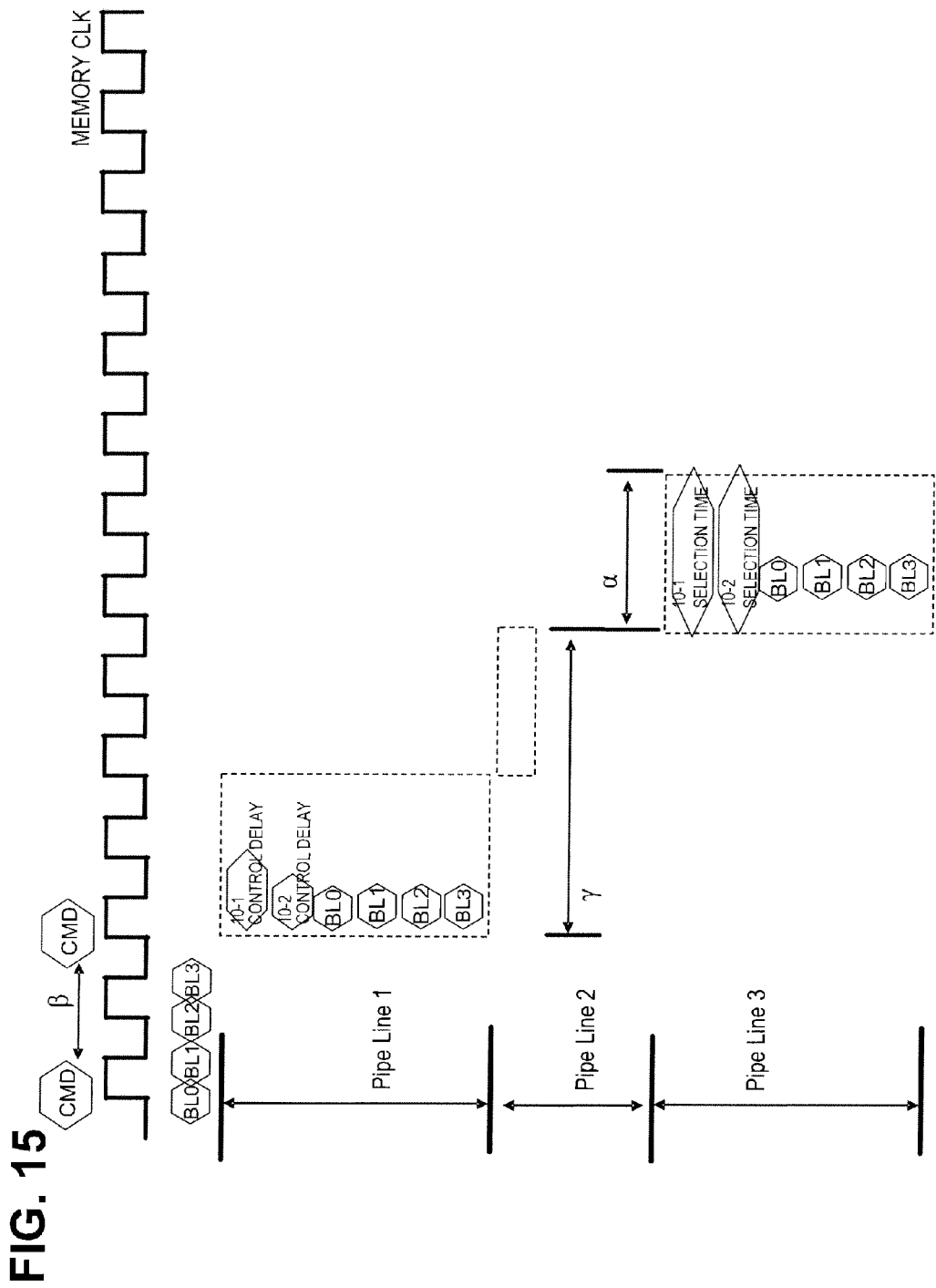
FIG. 15 is a timing chart for describing a Write operation (1 Write operation) in the second exemplary embodiment of the present invention.

FIG. 15 is a timing chart describing single Write operation in FIG. 13. The four bit data corresponding to a burst length of 4 at two clock cycles from an input of CMD (Write command) is serially input to a data terminal from the internal data bus 9, address generation at the third and fourth clock cycle control delay and output of the four bit data in parallel to the RWBS are performed, there is a pipeline gap at the 5th and 6th clock cycles, transfer is performed to a bit line of a column selected at the 7th and 8th clocks, and writing of data is performed to a selected cell.

Figure 16:
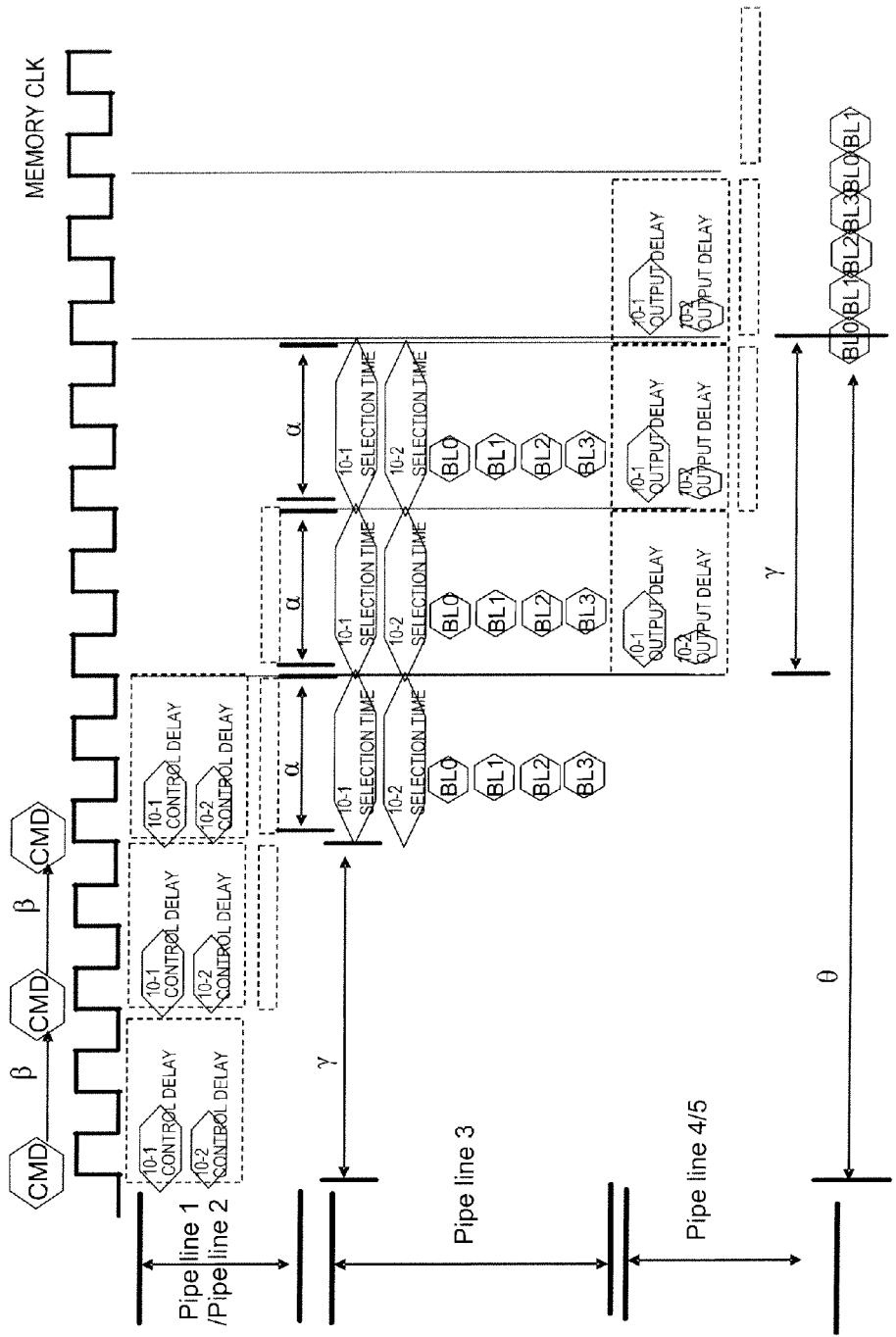
FIG. 16 is a timing chart for describing consecutive Read operations in the second exemplary embodiment of the present invention.
Figure 17:
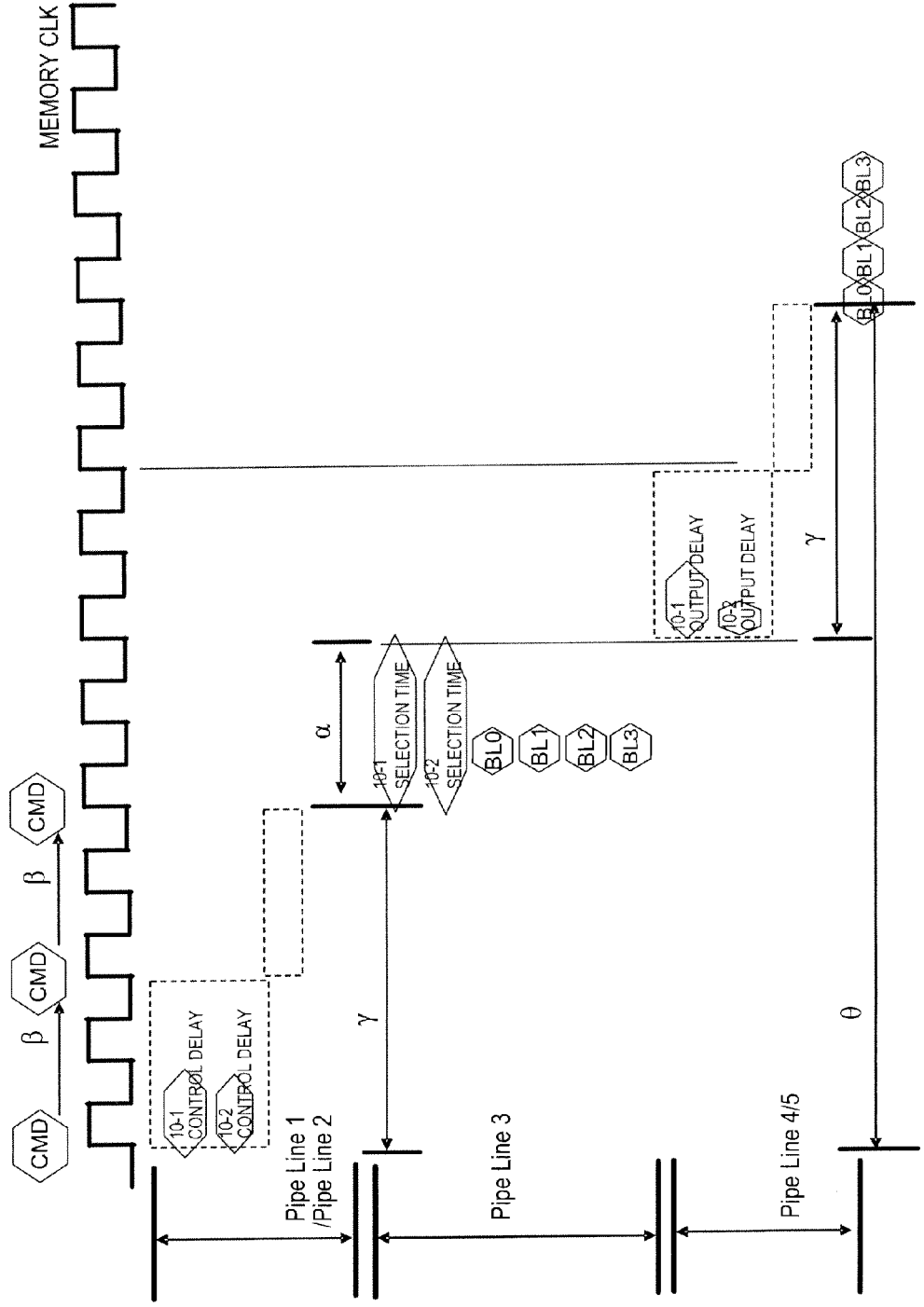
FIG. 17 is a timing chart for describing a Read operation (1 Read operation) in the second exemplary embodiment of the present invention.

FIG. 16 and FIG. 17 show timing charts read by a 5 stage pipeline configuration, in FIG. 13. FIG. 16 is a timing chart of consecutive Read operations. FIG. 17 is a timing chart of single Read operation.

As shown in FIG. 16, a time period of the first and second clock cycles corresponds to a control delay of the first Read command in which an address is generated, a time period of third and fourth clock cycles corresponds to a control delay of the second Read command, in which an address is generated and a time period of the fifth and sixth clock cycles corresponds to a control delay of the third Read command, in which an address is generated. The time period of the fifth and sixth clock cycles also corresponds to a selection time of the first Read command, in which four hit data BL0-BL3 are output from a memory cell of a selected address. The time period of the seventh and eighth clock cycles corresponds to a selection time of the second Read command, in which four bit data BL0-BL3 are output from a memory cell of a selected address. The forgoing read data is buffered. Output processing is performed for read data of the first Read command. The time period of the ninth and tenth clock cycles, corresponds to a selection time of the third Read command, in which four bit data BL0-BL3 are output from a memory cell of a selected address. The read data of the first Read command is buffered. Furthermore, output processing is performed for read data responsive to the second Read command. Read data of the first Read command from an eleventh clock is output serially to the internal data bus 9 by a data terminal. It is to be noted that both the control delay and output delay have γ=4 clock cycles.

As shown in FIG. 17, in a case where a Read command is input as a single shot command, there is a selection time after γ=4 clock cycles (Pipeline 3), and reading of data from a memory cell is performed (α). Thereafter, after γ=4 clock cycles, read data is output to the internal data bus 9 from a data terminal (Pipeline 4/5).

TABLE 2

|  | Td1 (1/f1) | Td2 (1/f2) | Latency |
|---|---|---|---|
| Related technology | 1 cycle (=γ) | 3 cycles (=α) | 4 cycles (=θ) |
| Present exemplary embodiment | 4 cycles (=4γ) | 2 cycles (=(2/3)α) | 10 cycles (=(10/4)θ) |

As summarized in the Table 2, with regard to f1 and f2, in the present exemplary embodiment, as compared to the related technology, f1 is ¼ (γ becomes 4 y). When the delay γ' becomes 4 times as large, it is possible to lower the power to ¼ thereof. Read latency according to the present embodiment is 10/4=2.5 times as large. It is to be noted that in Table 2, α=3 cycles for Td2 (1/f2) for the related technology and includes a control delay (γ) of 1 cycle (refer to FIG. 8 and FIG. 9), and in the present exemplary embodiment, γ is removed from this α (=3 cycles), and the selection time α is 2 cycles.

Third Exemplary Embodiment

Figure 18:
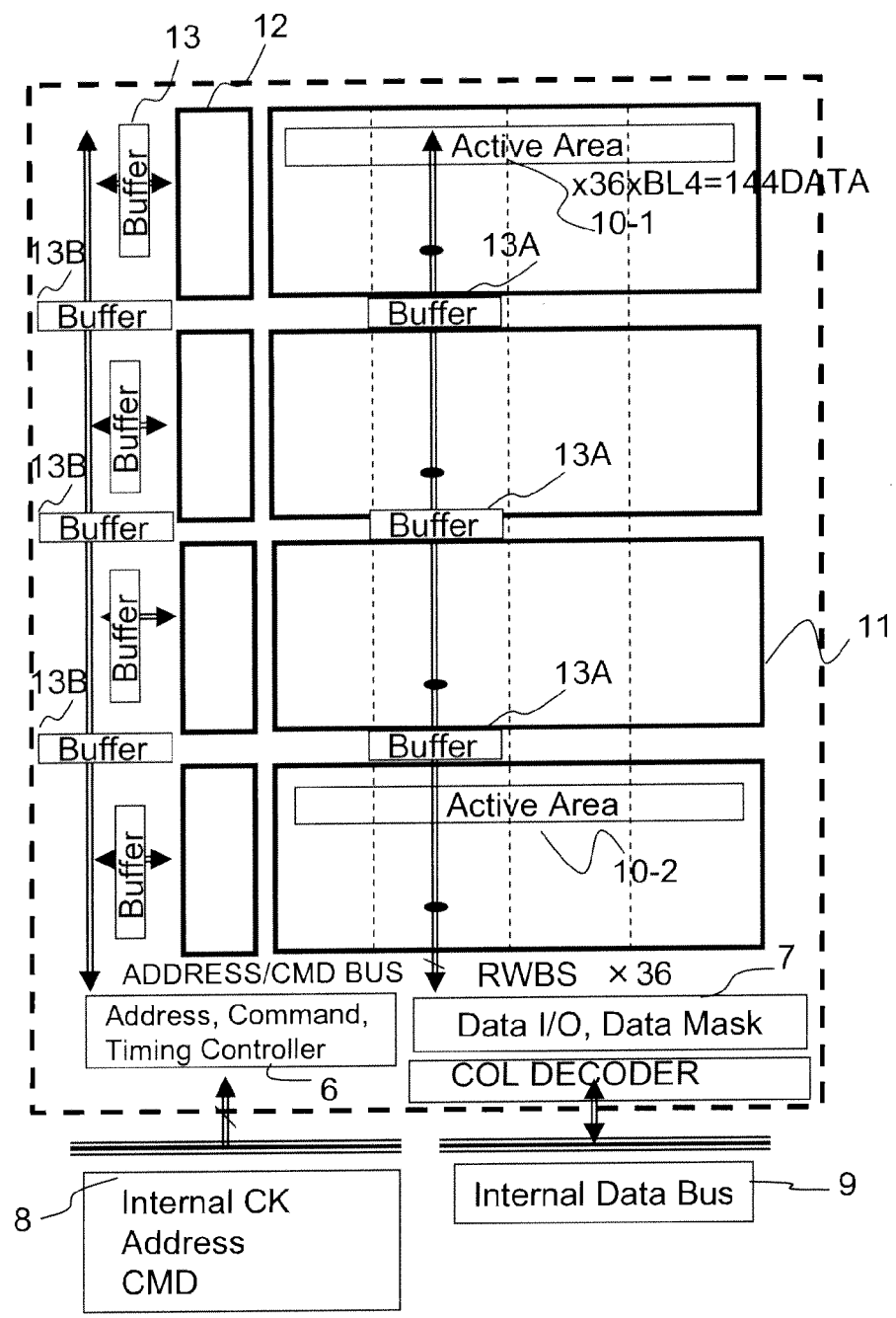
FIG. 18 is a diagram for describing a third exemplary embodiment of the present invention.

FIG. 18 is a diagram showing a configuration of a third exemplary embodiment of the present invention. In FIG. 18, elements that are the same or equivalent to those in FIG. 13 are given the same reference symbols. The following describes mainly points of difference from FIG. 12. Referring to FIG. 18, in the present exemplary embodiment, buffers 13 are inserted on ADDRESS/CMD BUS and RWBS, on per a memory cell array basic unit 11 or a memory macro basis.

Figure 19:
FIG. 19 is a timing chart for describing a Write operation (1 Write operation) in the third exemplary embodiment of the present invention.
Figure 20:
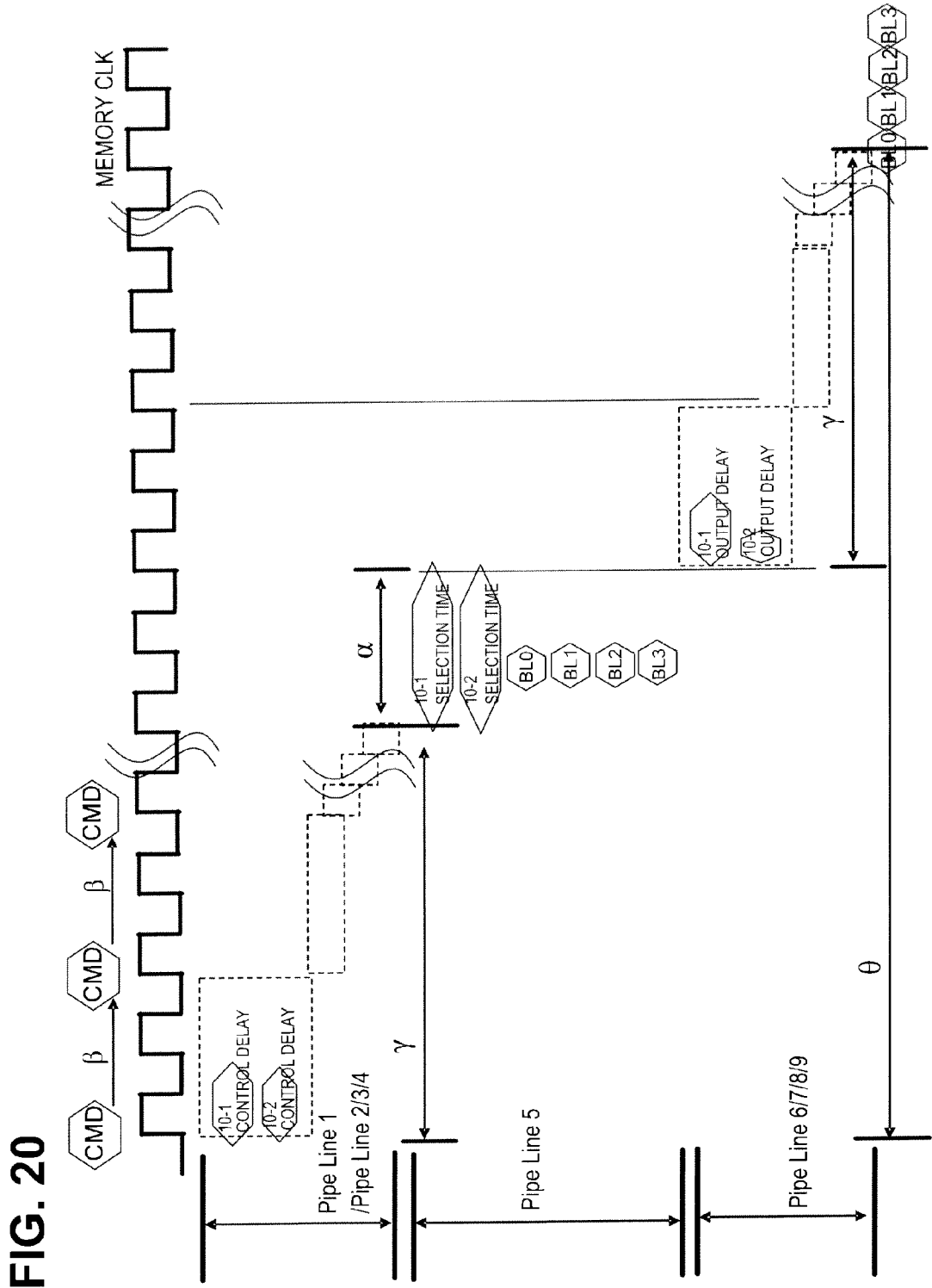
FIG. 20 is a timing chart for describing a Read operation (1 Read operation) in the third exemplary embodiment of the present invention.

FIG. 19 shows a timing chart of the operation of one Write command (single shot command) and FIG. 20 shows a timing chart of the operation of one Read command (single shot command), in the third exemplary embodiment of the present invention.

As shown in FIG. 19, four bit data corresponding to a burst length=4 are input to a data terminal in first and second clock cycles in response to input of a Write command (CMD). There is a control delay of two clock cycles from the third clock cycle, address generation and serial to parallel conversion of the four bit data are performed, and there is a selection time (α) of two clock cycles from an eleventh clock cycle (γ=8 clock cycles).

Furthermore, as shown in FIG. 20, address generation is performed in a control delay of two clock cycles in response to input of a Read command. After γ=8 clock cycles, there is a selection time (α) of two clock cycles in which four bit data are output in parallel from memory cells. Then, there is an output delay of two clock cycles, in which the four bit data read at the selection time after γ=8 clock cycles are output. Latency from input of a Read command to output of a read bit data BLO from a data terminal is 8+2+8=18 clock cycles.

TABLE 3

|  | Td1 (1/f1) | Td2 (1/f2) | Latency |
|---|---|---|---|
| Related technology | 1 cycle (=γ) | 3 cycles (=α) | 4 cycles (=θ) |
| Present exemplary embodiment | 8 cycles (=8γ) | 2 cycles (=(2/3)α) | 18 cycles (=(18/4)θ) |

As summarized in Table 3, with regard to f1 and f2, in the present exemplary embodiment, as compared to the related technology, f1 is ⅛ (γ becomes 8γ), and the latency is 18/4 times.

As described above, in the exemplary embodiments, there is provided a memory array arrangement in which, by pipelining access to a memory cell, the latency is extended but a cycle (α) is shortened.

In this way, lower power consumption is made possible with a tradeoff of θ and γ, while improving or maintaining α and β. According to the exemplary embodiments, there is provided a memory array having a configuration in which, by a tradeoff of γ and latency with power, power is reduced while maintaining or reducing the cycle (α).

It is to be noted that each disclosure of the above-mentioned Patent Document 1 is incorporated herein by reference. Modifications and adjustments of embodiments are possible within the bounds of the entire disclosure (including the scope of the claims) of the present invention, and also based on fundamental technological concepts thereof. Furthermore, a wide variety of combinations and selections of various disclosed elements is possible within the scope of the claims of the present invention. That is, the present invention clearly includes every type of transformation and modification that a person skilled in the art can realize according to the entire disclosure including the scope of the claims and to technological concepts thereof. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A semiconductor device comprising:
    a memory cell array made up of a plurality of basic units, each of said plurality of basic units including a plurality of memory cells, data being able to be written and read to and from each of said plurality of memory cells;
    a first bus that is arranged in common for said plurality of basic units of said memory cell array and that transfers write data and read data;
    a second bus that is arranged in common for said plurality of basic units of said memory cell array and that transfers an address/command;
    a plurality of first buffer circuits, each of which is arranged in correspondence with each of said plurality of basic units of said memory cell array and receives an address/command transferred on said second bus to supply said address/command received to said each of said plurality of basic units,
    an address/command control unit that generates an address/command responsive to each of a write command and a read command to send the generated address/command to said second bus; and
    a data input/output control unit that sends write data to said first bus and receives read data from said first bus,
    each of said plurality of basic units of said memory cell array including:
    a first amplifier that receives write data to be written to a memory cell, transferred on said first bus and amplifies said write data; and
    a second amplifier that amplifies read data read from a memory cell and outputs said amplified read data to said first bus, wherein
    there are provided first to third time periods each constituting a unit period for pipeline control,
    said first time period including a control delay in which an address/command to be transferred to said second bus is generated by said address/command control unit in response to each of write and read commands, and in which write data to said first bus is prepared by said data input/output control unit in response to said write command, said second time period including a selection time in which in said basic unit of said memory cell array, writing to a selected memory cell for said write command or reading from a selected memory cell for said read command is performed, and said third time period including an output delay in which said data input/output control unit receives read data transferred on said first bus and outputs said read data to a data terminal, said read data being output to said first bus by said second amplifier in said selection time associated with said read command, said first time period having a length greater than or equal to said second time period.

2. The semiconductor device according to claim 1, wherein said third time period has a length greater than or equal to said second time period.

3. The semiconductor device according to claim 1, wherein both said first time period and said third time period have a length the same as said second time period.

4. The semiconductor device according to claim 1, wherein a time period in which a plurality of items of data are serially input from a data terminal in write access, and a time period in which a plurality of items of data are serially output from a data terminal in read access have a length the same as said second time period.

5. The semiconductor device according to claim 4, wherein said data input/output control unit converts said plurality of items of data serially input from said data terminal into parallel data transferred in parallel on said first bus, and converts a plurality of items of data transferred in parallel on said first bus into a plurality of items of data serially output from said data terminal.

6. The semiconductor device according to claim 1, wherein said first time period is made longer than a time required for said control delay and said third time period is made longer than a time required for said output delay to elongate latency of read access.

7. The semiconductor device according to claim 1, wherein said first bus includes one or more second buffer circuits between said basic unit located at a far end and said basic unit located at a near end as from said data input/output control unit.

8. The semiconductor device according to claim 1, wherein said second bus includes one or more third buffer circuits between said basic unit located at a far end and said basic unit located at a near end from said address/command control unit.

9. The semiconductor device according to claim 7, wherein said first bus includes said second buffer circuit between adjacent ones of said basic units.

10. The semiconductor device according to claim 8, wherein said second bus includes said third buffer circuit between adjacent ones of said basic units.

11. The semiconductor device according to claim 7, wherein said second buffer circuit comprises:

a first tri-state buffer that receives write data from said first bus, and based on a write permission control signal and address space selection logic, controls transmission and non-transmission of said write data to a succeeding stage of said first bus, a second tri-state buffer that receives read data from said succeeding stage of said first bus to which output of said first tri-state buffer is connected, an based on a read permission control signal and address space selection logic, controls transmission and non-transmission of said read data to a preceding stage of said first bus; and a latch circuit that latches output of said first tri-state buffer.

12. The semiconductor device according to claim 8, wherein said third buffer circuit comprises:

a tri-state buffer that receives an address/command from said second bus, and based on a permission control signal and address space selection logic, controls transmission and non-transmission of said address/command to a succeeding stage of said second bus, and a latch circuit that latches output of said tri-state buffer.

13. The semiconductor device according to claim 1, further comprising a sub controller that is arranged between said first buffer circuit and a corresponding one of said basic units and that receives an address/command from said first buffer circuit and controls said basic unit.

14. The semiconductor device according to claim 1, wherein said memory cell array includes a plurality of word lines, said plurality of word lines being divided into a plurality of groups with a predetermined number thereof as a unit, and in correspondence with said respective groups, said memory cell array is divided into said basic units.

* * * * *